(12) United States Patent
Oh et al.

(10) Patent No.: US 12,249,376 B2
(45) Date of Patent: Mar. 11, 2025

(54) STORAGE DEVICES AND METHODS OF OPERATING STORAGE DEVICES

(71) Applicant: SAMSUNG ELECTRONICS CO., LTD., Suwon-si (KR)

(72) Inventors: Eun Chu Oh, Hwaseong-si (KR); Junyeong Seok, Seoul (KR); Younggul Song, Hwaseong-si (KR); Byungchul Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 183 days.

(21) Appl. No.: 17/749,691

(22) Filed: May 20, 2022

(65) Prior Publication Data

US 2023/0111033 A1   Apr. 13, 2023

(30) Foreign Application Priority Data

Oct. 7, 2021   (KR) .................. 10-2021-0132919

(51) Int. Cl.
*G11C 11/00*   (2006.01)
*G11C 16/04*   (2006.01)
*G11C 16/08*   (2006.01)
*G11C 16/24*   (2006.01)
*G11C 16/26*   (2006.01)

(52) U.S. Cl.
CPC .......... *G11C 16/08* (2013.01); *G11C 16/0483* (2013.01); *G11C 16/24* (2013.01); *G11C 16/26* (2013.01)

(58) Field of Classification Search
CPC ..... G11C 16/08; G11C 16/0483; G11C 16/24; G11C 16/26
See application file for complete search history.

(56) References Cited

U.S. PATENT DOCUMENTS

| | | |
|---|---|---|
| 8,587,997 B2 | 11/2013 | Kim et al. |
| 8,621,318 B1 * | 12/2013 | Micheloni ........... G06F 11/1012 |
| | | 714/755 |
| 9,502,137 B2 | 11/2016 | Yoon et al. |
| 9,575,833 B2 | 2/2017 | Jeon |
| 9,818,488 B2 | 11/2017 | Sankaranarayanan et al. |
| 10,061,641 B2 * | 8/2018 | Kim ..................... G06F 11/1012 |
| 10,083,069 B2 | 9/2018 | Jeon et al. |
| 10,580,514 B2 | 3/2020 | Wu et al. |
| 2015/0046771 A1 * | 2/2015 | Kim .................. H03M 13/3738 |
| | | 714/764 |
| 2020/0358459 A1 | 11/2020 | Haga |

* cited by examiner

*Primary Examiner* — Pho M Luu
(74) *Attorney, Agent, or Firm* — Sughrue Mion, PLLC

(57) ABSTRACT

A storage device, including a nonvolatile memory device and a storage controller configured to control the nonvolatile memory device. The nonvolatile memory device includes a memory cell array including a plurality of word-lines stacked on a substrate, a plurality of memory cells provided in a plurality of channel holes, and a word-line cut region dividing the plurality of word-lines into a plurality of memory blocks. The storage controller groups a plurality of target memory cells into outer cells and inner cells. The storage controller includes an error correction code (ECC) decoder configured to perform an ECC decoding operation by obtaining outer cell bits and inner cell bits during a read operation on the plurality of target memory cells, and applying different log likelihood ratio (LLR) values to the outer cell bits and the inner cell bits.

19 Claims, 26 Drawing Sheets

|  | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| LSB | 1 | 0 | 0 | 0 | 1 | 1 | 0 | 0 | 0 | 0 | 0 | 1 | 1 | 1 | 1 | 1 |
| ESB | 1 | 1 | 1 | 0 | 0 | 0 | 0 | 1 | 1 | 0 | 0 | 0 | 0 | 1 | 1 | 1 |
| USB | 1 | 1 | 1 | 1 | 1 | 0 | 0 | 0 | 0 | 0 | 1 | 1 | 0 | 0 | 0 | 1 |
| MSB | 1 | 1 | 0 | 0 | 0 | 0 | 0 | 0 | 1 | 1 | 1 | 1 | 1 | 1 | 0 | 0 |

STORAGE DEVICES AND METHODS OF OPERATING STORAGE DEVICES

CROSS-REFERENCE TO RELATED APPLICATIONS

This application is based on and claims priority under 35 U.S.C. § 119 to Korean Patent Application No. 10-2021-0132919, filed on Oct. 7, 2021 in the Korean Intellectual Property Office, the disclosure of which is incorporated by reference herein in its entirety.

BACKGROUND

1. Field

Example embodiments generally relate to semiconductor integrated circuits, and more particularly to storage devices and methods of operating storage devices.

2. Description of Related Art

Semiconductor memory devices may be classified into a volatile memory and a nonvolatile memory.

The volatile memory may lose contents stored therein at power-off. The nonvolatile memory may retain stored contents even at power-off. A flash memory, which may be an example of a nonvolatile memory device, may have several advantages, for example mass storage capability, relatively high noise immunity, and low power operation. Therefore, the flash memory devices are employed in various fields. For example, a mobile system such as a smart-phone, or a tablet PC may employ the flash memory as storage medium.

As a fabrication process of a flash memory device is scaled-down and memory cells of the flash memory device are stacked, the memory cells may be degraded, and data retention characteristic of the memory cells may be degraded.

SUMMARY

Provided is a storage device capable of enhancing error correction capability.

Provided is a method of storage device, capable of enhancing error correction capability.

Additional aspects will be set forth in part in the description which follows and, in part, will be apparent from the description, or may be learned by practice of the presented embodiments.

In accordance with an aspect of the disclosure, a storage device includes a nonvolatile memory device including a memory cell array, wherein the memory cell array includes: a plurality of word-lines stacked on a substrate, a plurality of memory cells provided in a plurality of channel holes extending in a vertical direction with respect to the substrate, and a word-line cut region extending in a first horizontal direction and dividing the plurality of word-lines into a plurality of memory blocks; and a storage controller configured to control the nonvolatile memory device, wherein the storage controller is configured to group a plurality of target memory cells coupled to a target word-line into outer cells and inner cells based on a location index of each target memory cell of the target memory cells, wherein a distance between the outer cells and the word-line cut region is smaller than a distance between the inner cells and the word-line cut region, wherein the storage controller includes an error correction code (ECC) decoder configured to perform an ECC decoding operation on an ECC sector by: obtaining outer cell bits which are read from the outer cells in the ECC sector during a read operation on the plurality of target memory cells, and inner cell bits which are read from the inner cells in the ECC sector during the read operation; and applying different log likelihood ratio (LLR) values to the outer cell bits and the inner cell bits.

In accordance with an aspect of the disclosure, a method of operating a storage device includes a nonvolatile memory device which includes a memory cell array, the memory cell array including a plurality of word-lines stacked on a substrate, a plurality of memory cells provided in a plurality of channel holes extending in a vertical direction with respect to the substrate, and a word-line cut region extending in a first horizontal direction and dividing the plurality of word-lines into a plurality of memory blocks, the method including grouping, by a storage controller configured to control the nonvolatile memory device, a plurality of target memory cells coupled to a target word-line into outer cells and inner cells based on a location index of each target memory cell of the target memory cells, wherein a distance between the outer cells and the word-line cut region is smaller than a distance between the inner cells and the word-line cut region; obtaining, by an error correction code (ECC) decoder included in the storage controller, outer cell bits which are read from the outer cells in the ECC sector during a read operation on the plurality of target memory cells, and inner cell bits which are read from the inner cells in the ECC sector during the read operation applying, by the ECC decoder, different log likelihood ratio (LLR) values to outer cell bits and inner cell bits; and performing, by the ECC decoder, an ECC decoding operation on an ECC sector based on the different LLR values.

In accordance with an aspect of the disclosure, a storage device includes a nonvolatile memory device including a memory cell array, wherein the memory cell array includes a plurality of word-lines stacked on a substrate, a plurality of memory cells provided in a plurality of channel holes extending in a vertical direction with respect to the substrate, and a word-line cut region extending in a first horizontal direction and dividing the plurality of word-lines into a plurality of memory blocks; and a storage controller configured to control the nonvolatile memory device, wherein the storage controller is configured to group a plurality of target memory cells into outer cells and inner cells based on a location index of each target memory cell of the target memory cells, wherein a distance between the outer cell and the word-line cut region is smaller than a distance between the inner cell and the word-line cut region, wherein the storage controller includes an error correction code (ECC) decoder configured to perform an ECC decoding operation on an ECC sector by: obtaining outer cell bits which are read from the outer cells in the ECC sector during a read operation on the plurality of target memory cells, and inner cell bits which are read from the inner cells in the ECC sector during the read operation; and applying different log likelihood ratio (LLR) values to the outer cell bits and the inner cell bits, wherein the ECC decoder is further configured to: apply a first set of LLR values to the outer cell bits and to apply a second set of LLR values to the inner cell bits, wherein a first number of the first set of LLR values is greater than a second number of the second set of LLR values; perform a soft decision decoding on the ECC sector by applying different LLR intervals to the outer cell bits and the inner cell bits; and apply a first LLR value to the outer cell bits and a second LLR value to the inner cell bits during a single LLR interval from among the different LLR intervals, wherein an absolute value of the first LLR value is smaller than an absolute value of the second LLR value.

In accordance with an aspect of the disclosure, a storage device includes a plurality of memory cells provided in a plurality of channel holes extending through a plurality of word-lines stacked on substrate, wherein the plurality memory cells are coupled to a word-line from among the plurality of word-lines; and a word-line cut region dividing the plurality of word-lines into a plurality of memory blocks; and an error correction code (ECC) decoder configured to: obtain a first bit read from a first memory cell and a second bit read from a second memory cell during a read operation on the plurality of memory cells, perform ECC decoding on an ECC sector corresponding to the first memory cell and the second memory cell by applying a first log likelihood ratio (LLR) value to the first bit and a second LLR value to the second bit, wherein the first LLR value is different from the second LLR value, wherein the first LLR value is determined based on a distance between the first memory cell and the word-line cut region, and the second LLR value is determined based on a distance between the second memory cell and the word-line cut region.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION OF EMBODIMENTS

Figure 1:
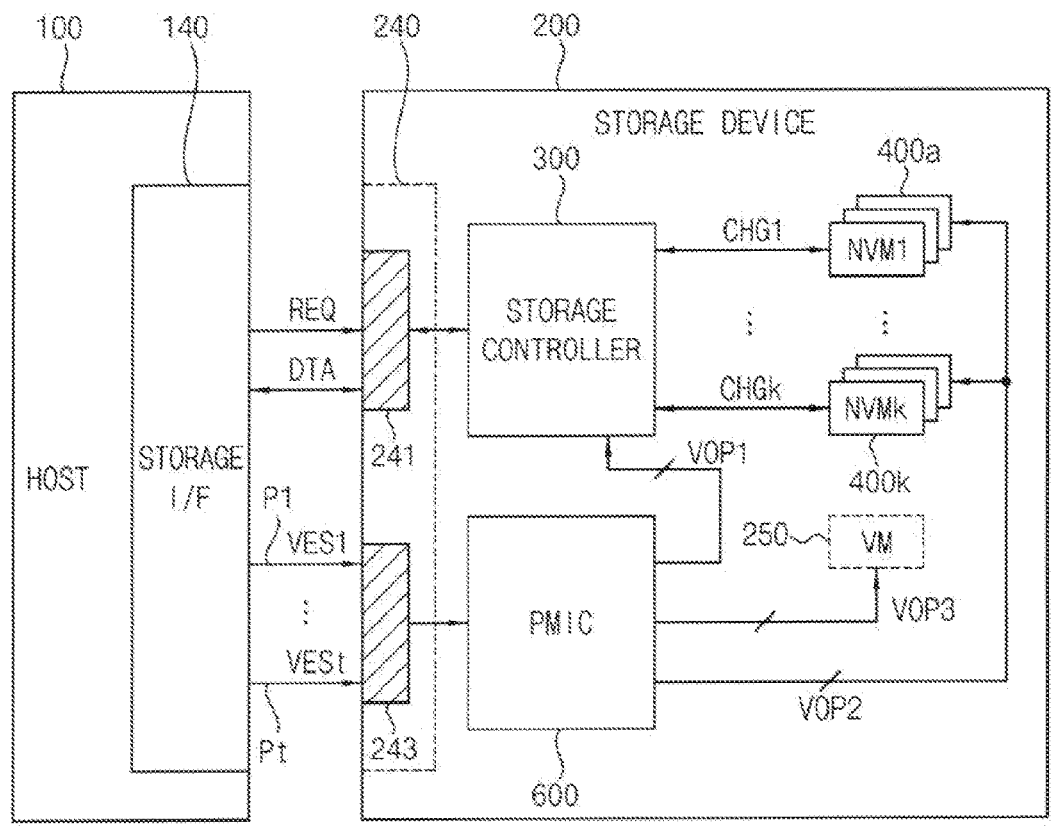
FIG. 1 is a block diagram illustrating a storage system according to an embodiment.

Various example embodiments will be described more fully hereinafter with reference to the accompanying drawings, in which some example embodiments are shown.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

FIG. 1 is a block diagram illustrating a storage system according to example embodiments.

Referring to FIG. 1, a storage system 50 may include a host 100 and a storage device 200. The host 100 may include a storage interface (I/F) 140. The storage device 200 may be any kind of storage device.

The storage device 200 may include a storage controller 300, a plurality of nonvolatile memory devices 400a to 400k (where k is an integer greater than two), a power management integrated circuit (PMIC) 600 and a host interface 240. The host interface 240 may include a signal connector 241 and a power connector 243. The storage device 200 may further include a volatile memory device 250.

The plurality of nonvolatile memory devices 400a to 400k may be used as a storage medium of the storage device 200. In some example embodiments, each of the plurality of nonvolatile memory devices 400a to 400k may include a flash memory or a vertical NAND memory device. The storage controller 300 may be coupled to the plurality of nonvolatile memory devices 400a to 400k through a plurality of channels CHG1 to CHGk, respectively.

The storage controller 300 may be configured to receive a request REQ from the host 100 and communicate data DTA with the host 100 through the signal connector 241. The storage controller 300 may write the data DTA to the plurality of nonvolatile memory devices 400a to 400k or read the data DTA from plurality of nonvolatile memory devices 400a to 400k based on the request REQ.

The storage controller 300 may communicate the data DTA with the host 100 using the volatile memory device 250 as an input/output buffer. In some example embodiments, the volatile memory device 250 may include a dynamic random access memory (DRAM).

The PMIC 600 may be configured to receive a plurality of power supply voltages VES1-VESt, which may be for example external supply voltages, from the host 100 through the power connector 243. For example, the power connector 243 may include a plurality of power lines P1 to Pt, and the power connector 243 may be configured to receive the plurality of power supply voltages VES1 to VESt from the host 100 through the plurality of power lines P to Pt, respectively, and provide the plurality of power supply voltages VES1 to VESt to the PMIC 600. Here, t represents a positive integer greater than one.

The PMIC 600 may generate at least one first operating voltage VOP1 used by the storage controller, at least one second operating voltage VOP2 used by the plurality of nonvolatile memory devices 400a to 400k, and at least one third operating voltage VOP3 used by the volatile memory device 250 based on the plurality of power supply voltages VES1 to VESt.

For example, when the PMIC 600 receives all of the plurality of power supply voltages VES1 to VESt from the host 100, the PMIC 600 may generate the at least one first operating voltage VOP1, the at least one second operating voltage VOP2, and the at least one third operating voltage VOP3 using all of the plurality of power supply voltages VES1 to VESt. In embodiments, when the PMIC 600 receives less than all of the plurality of power supply voltages VES1 to VESt from the host 100, the PMIC 600 may generate the at least one first operating voltage VOP1, the at least one second operating voltage VOP2, and the at least one third operating voltage VOP3 using all of the part of the plurality of power supply voltages VES1 to VESt that is received from the host 100.

Figure 2:
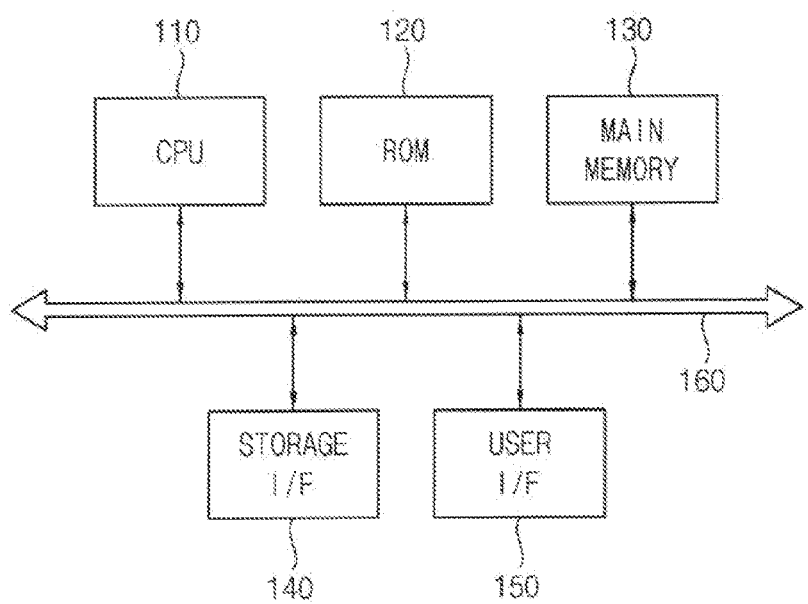
FIG. 2 is a block diagram illustrating the host in FIG. 1 according to an embodiment.

FIG. 2 is a block diagram illustrating the host in FIG. 1 according to example embodiments.

Referring to FIG. 2, the host 100 may include a central processing unit (CPU) 110, a read-only memory (ROM) 120, a main memory 130, a storage interface (I/F) 140, a user interface (I/F) 150 and a bus 160.

The bus 160 may refer to a transmission channel via which data is transmitted between the CPU 110, the ROM 120, the main memory 130, the storage interface 140 and the user interface 150 of the host 100. The ROM 120 may store various application programs. For example, application programs supporting storage protocols such as Advanced Technology Attachment (ATA), Small Computer System Interface (SCSI), embedded Multi Media Card (eMMC), and/or Universal flash storage (UFS) protocols are stored.

The main memory 130 may temporarily store data or programs. The user interface 150 may be a physical or virtual medium for exchanging information between a user and the host 100, a computer program, etc., and includes physical hardware and logical software. For example, the user interface 150 may include an input device for allowing the user to manipulate the host 100, and an output device for outputting a result of processing an input of the user.

The CPU 110 may control overall operations of the host 100. The CPU 110 may generate a command for storing data in the storage device 200 or a request (or a command) for reading data from the storage device 200 by using an application stored in the ROM 120, and transmit the request to the storage device 200 via the storage interface 140.

Figure 3:
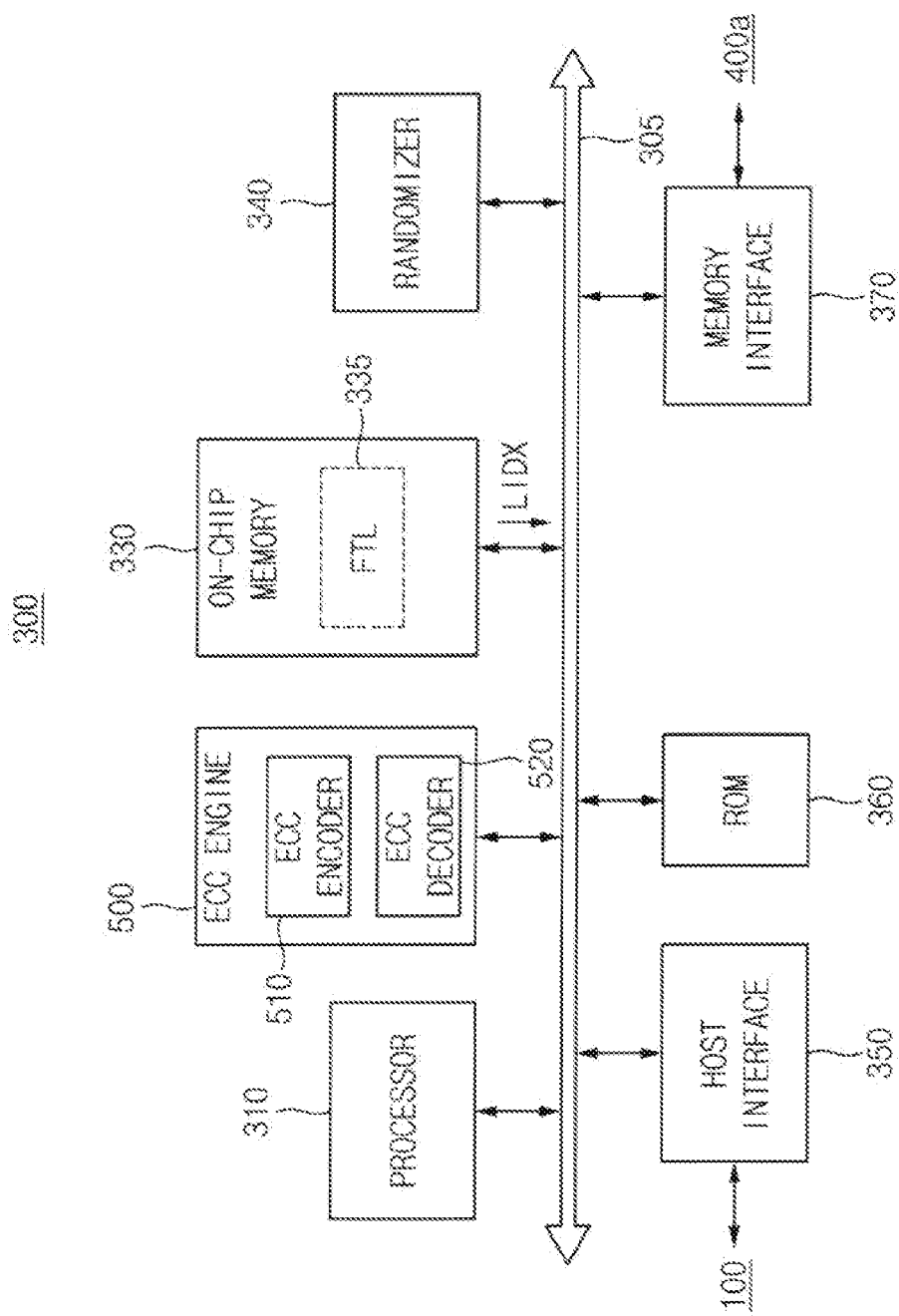
FIG. 3 is a block diagram illustrating an example of the storage controller in the storage device in FIG. 1 according to an embodiment.

FIG. 3 is a block diagram illustrating an example of the storage controller in the storage device in FIG. 1 according to example embodiments.

Referring to FIG. 3, the storage controller 300 may include a processor 310, an error correction code (ECC) engine 500, an on-chip memory 330, randomizer 340, a host interface (I/F) 350, a ROM 360 and a nonvolatile memory (NVM) interface (I/F) 370 which are connected via a bus 305.

The processor 310 controls an overall operation of the storage controller 300. The processor 310 may control the ECC engine 500, the on-chip memory 330, the randomizer 340, the host interface 350, the ROM 360 and the nonvolatile memory interface 370. The processor 310 may include one or more cores (e.g., a homogeneous multi-core or a heterogeneous multi-core). The processor 310 may be or include, for example, at least one of a central processing unit (CPU), an image signal processing unit (ISP), a digital signal processing unit (DSP), a graphics processing unit (GPU), a vision processing unit (VPU), and a neural processing unit (NPU). The processor 310 may execute various application programs (e.g., a flash translation layer (FTL) 335 and firmware) loaded onto the on-chip memory 330.

The on-chip memory 330 may store various application programs that are executable by the processor 310. The on-chip memory 330 may operate as a cache memory adjacent to the processor 310. The on-chip memory 330 may store a command, an address, and data to be processed by the processor 310 or may store a processing result of the processor 310. The on-chip memory 330 may be, for example, a storage medium or a working memory including a latch, a register, a static random access memory (SRAM), a dynamic random access memory (DRAM), a thyristor random access memory (TRAM), a tightly coupled memory (TCM), etc.

The processor 310 may execute the FTL 335 loaded onto the on-chip memory 330. The FTL 335 may be loaded onto the on-chip memory 330 as firmware or a program stored in the one of the nonvolatile memory devices 400a to 400k. The FTL 335 may manage mapping between a logical address provided from the host 100 and a physical address of the nonvolatile memory devices 400a to 400k and may include an address mapping table manager managing and updating an address mapping table. The FTL 335 may further perform a garbage collection operation, a wear leveling operation, and the like, as well as the address mapping described above. The FTL 335 may be executed by the processor 310 for addressing one or more of the following aspects of the nonvolatile memory devices 400a to 400k: overwrite- or in-place write-impossible, a life time of a memory cell, a limited number of program-erase (PE) cycles, and an erase speed slower than a write speed.

The FTL 335 may provide the ECC engine 500 with a location index LIDX that divide a plurality of memory cells included in each of a page of each of the nonvolatile memory devices 400a to 400k into outer cells and inner cells, which may mean grouping the plurality of memory cells such that each memory cell of the plurality of memory cells is designated as an outer cell or an inner cell. A distance between the outer cell and a word-line cut region is smaller than a distance between the inner cell and the word-line cut region.

Memory cells of the nonvolatile memory devices 400a to 400k may have a physical characteristic in which a threshold voltage distribution varies due to causes, such as a program elapsed time, a temperature, program disturbance, read disturbance and etc. For example, data stored at the nonvolatile memory devices 400a to 400k may become erroneous due to the above causes.

The storage controller 300 may utilize a variety of error correction techniques to correct such errors. For example, the storage controller 300 may include the ECC engine 500. The ECC engine 500 may correct errors which occur in the data stored in the nonvolatile memory devices 400a to 400k. The ECC engine 500 may include an ECC encoder 510 and an ECC decoder 520. The ECC encoder 510 may perform an ECC encoding operation on data to be stored in the nonvolatile memory devices 400a to 400k. The ECC decoder 520 may perform an ECC decoding operation on data read from the nonvolatile memory devices 400a to 400k.

The storage controller 300 may divide a plurality of target memory cells coupled to a target word-line into outer cells and inner cells based on the location index LIDX of each of the target memory cells in a read operation on the plurality of target memory cells. A distance between the outer cell and the word-line cut region is smaller than a distance between the inner cell and the word-line cut region. The ECC decoder 520 may perform an ECC decoding operation on an ECC sector by applying different log likelihood ratio (LLR) values to outer cell bits and inner cell bits. For example, the ECC decoder 520 may perform an ECC decoding operation on an ECC sector by applying a first LLR value to one or more outer cell bits, and applying a second LLR value to one or more inner cell bits, and the first LLR value may be different from the second LLR value. The outer cell bits are read from the outer cells in an ECC sector, the inner cell bits are read from the inner cells in the ECC sector, and the ECC sector corresponds to a unit of an ECC operation.

The ROM 360 may store a variety of information, needed for the storage controller 300 to operate, in firmware.

The randomizer 340 may randomize data to be stored in one of the nonvolatile memory devices 400a to 400k. For example, the randomizer 340 may randomize data to be stored in one of the nonvolatile memory devices 400a to 400k by a word-line.

Data randomizing may include processing data such that program states of memory cells connected to a word-line have the same ratio. For example, if memory cells connected to one word-line are quad-level cells (QLC) each storing 4-bit data, each of the memory cells may have one of an erase state and first through fifteenth program states. In this case, the randomizer 340 may randomize data such that in memory cells connected to one word-line, the number of memory cells having the erase state, and each of the number of memory cells having the first through fifteenth program states, may be substantially the same as one another. For example, memory cells in which randomized data is stored have program states of which the number is equal to one another.

The randomizer 340 may randomize page data. An example of an operation of the randomizer 340 is described below, however embodiments are not limited thereto. For example, the randomizer 340 may randomize data such that in memory cells connected to one word-line, the number of memory cells having the erase state and each of the number of memory cells having the first through fifteenth program states are approximately the same value. For example, memory cells in which randomized data is stored have program states of which the number may be similar to one another.

In embodiments, when the number of memory cells having the erase state and each of the number of memory cells having the first through fifteenth program states are approximately the same value, this may mean that the number of the number of memory cells having the erase state and each of the number of memory cells having the first through fifteenth program states are within a particular threshold number of each other.

The storage controller 300 may communicate with the host 100 through the host interface 350. For example, the host interface 350 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The storage controller 300 may communicate with the nonvolatile memory devices 400a to 400k through the nonvolatile memory interface 370.

Figure 4:
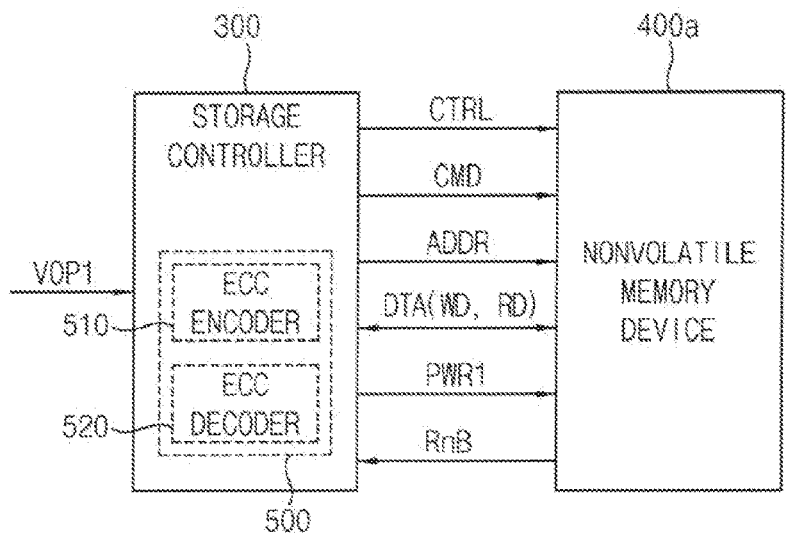
FIG. 4 is a block diagram illustrating a connection relationship between the storage controller and one nonvolatile memory device in the storage device of FIG. 1 according to an embodiment.

FIG. 4 is a block diagram illustrating a connection relationship between the storage controller and one nonvolatile memory device in the storage device of FIG. 1.

Referring to FIG. 4, the nonvolatile memory device 400a may operate based on the first operating voltage VOP1.

The nonvolatile memory device 400a may perform an erase operation, a program operation, and/or a write operation under control of the storage controller 300. The nonvolatile memory device 400a may receive a command CMD, an address ADDR, and data DTA, which may be for example user data such as a write data WD, through input/output lines from the storage controller 300 for performing such operations. In addition, the nonvolatile memory device 400a may receive a control signal CTRL through a control line and receives a power PWR1 through a power line from the storage controller 300. In addition, the nonvolatile memory device 400a may provide the storage controller 300 with the data DTA, for example a read data RD.

The storage controller 300 may include the ECC engine 500, and the ECC engine 500 may include the ECC encoder 510 and the ECC decoder 520. The ECC encoder 510 may perform an ECC encoding operation on data to be stored in the nonvolatile memory device 400a. The ECC decoder 520 may perform an ECC decoding operation on data read from the nonvolatile memory device 400a.

The storage controller 300 may divide a plurality of target memory cells coupled to a target word-line into outer cells and inner cells based on the location index LIDX of each of the target memory cells in a read operation on the plurality of target memory cells. A distance between the outer cell and the word-line cut region is smaller than a distance between the inner cell and the word-line cut region. The ECC decoder 520 may perform an ECC decoding operation on an ECC sector by applying different log likelihood ratio (LLR) values to outer cell bits and inner cell bits. The outer cell bits are read from the outer cells in an ECC sector, the inner cell bits are read from the inner cells in the ECC sector, and the ECC sector corresponds to a unit of an ECC operation.

Figure 5:
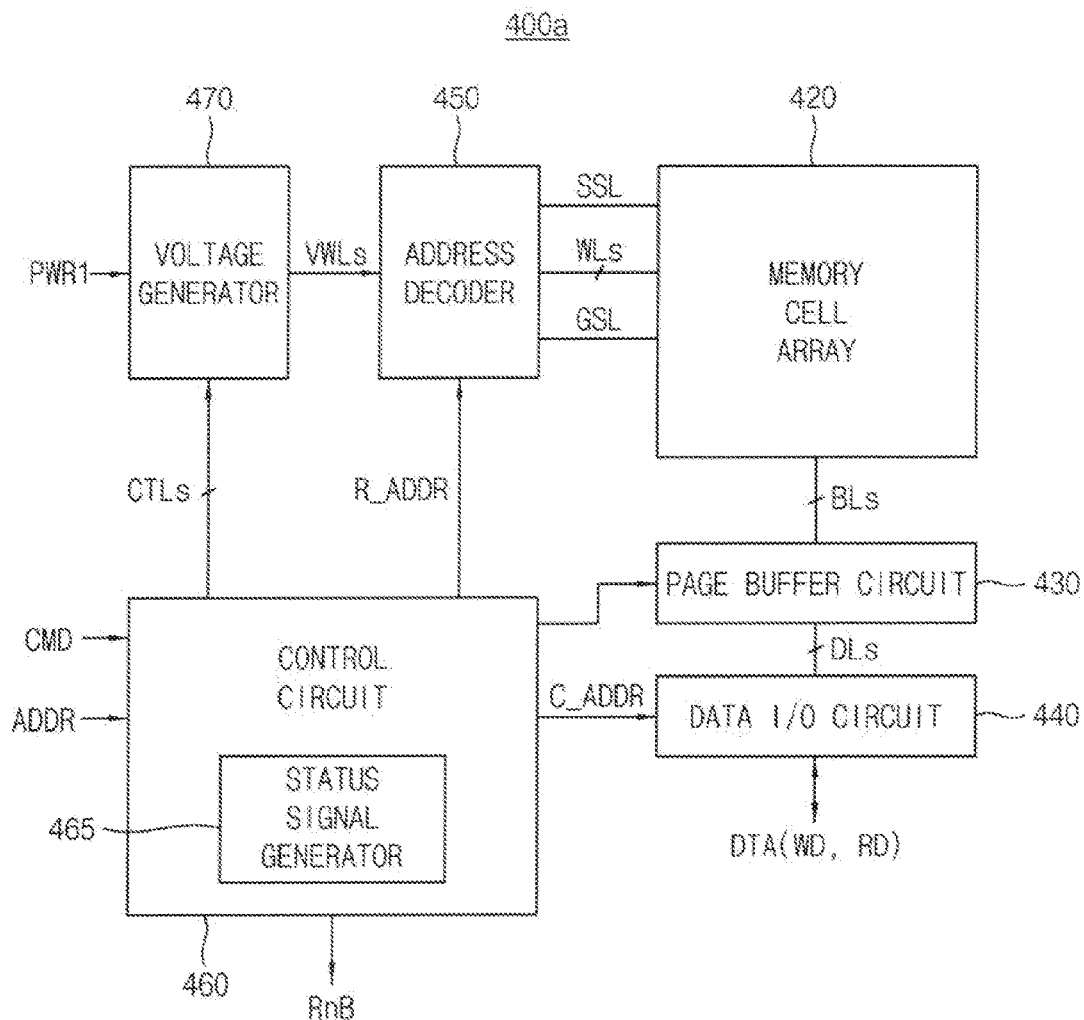
FIG. 5 is a block diagram illustrating the nonvolatile memory device in FIG. 4 according to some an embodiment.

FIG. 5 is a block diagram illustrating the nonvolatile memory device in FIG. 4 according to some example embodiments.

Referring to FIG. 5, the nonvolatile memory device 400a may include a memory cell array 420, an address decoder 450, a page buffer circuit 430, a data input/output (I/O) circuit 440, a control circuit 460, and a voltage generator 470.

The memory cell array 420 may be coupled to the address decoder 450 through a string selection line SSL, a plurality of word-lines WLs, and a ground selection line GSL. In addition, the memory cell array 420 may be coupled to the page buffer circuit 430 through a plurality of bit-lines BLs.

The memory cell array 420 may include a plurality of memory cells coupled to the plurality of word-lines WLs and the plurality of bit-lines BLs.

In some example embodiments, the memory cell array 420 may be or include a three-dimensional memory cell array, which is formed on a substrate in a three-dimensional structure (e.g., a vertical structure). In this case, the memory cell array 420 may include vertical cell strings that are vertically oriented such that at least one memory cell is located over another memory cell.

Figure 6:
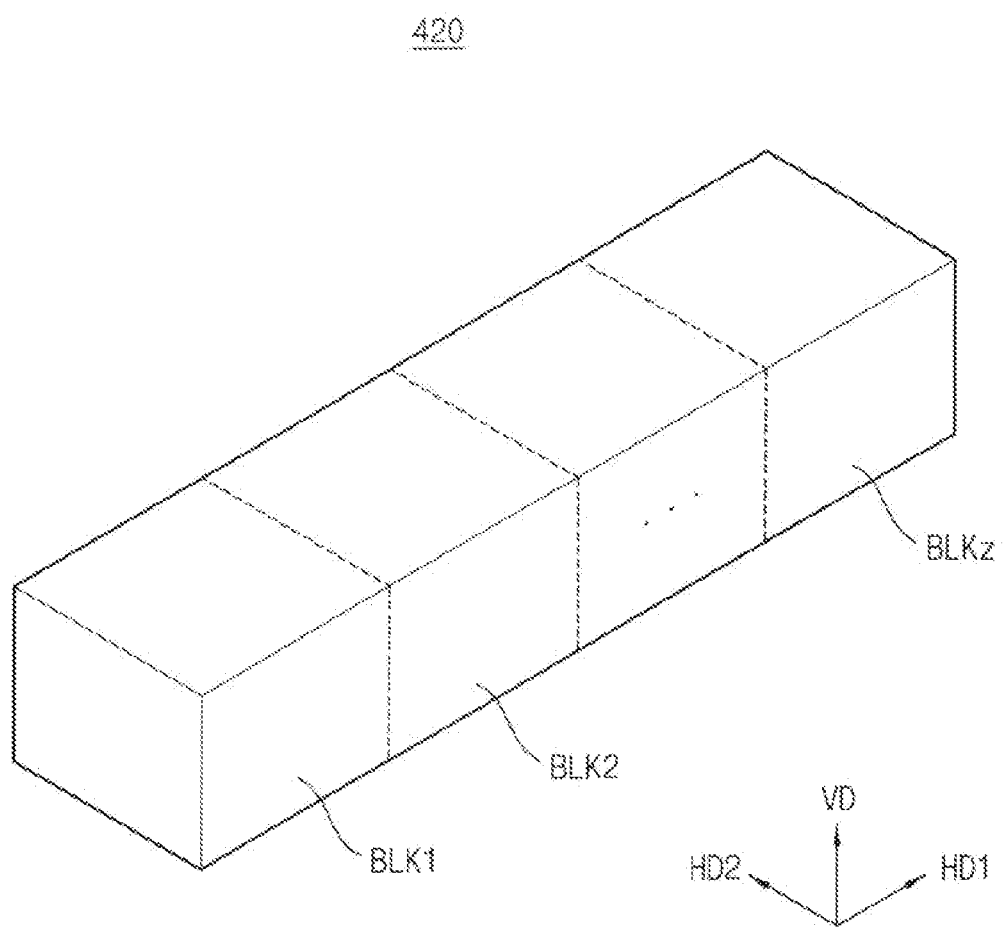
FIG. 6 is a block diagram illustrating the memory cell array in the nonvolatile memory device of FIG. 5 according to an embodiment.

FIG. 6 is a block diagram illustrating the memory cell array in the nonvolatile memory device of FIG. 5.

Referring to FIG. 6, the memory cell array 420 may include a plurality of memory blocks BLK1 to BLKz. The memory blocks BLK1 to BLKz extend along a first horizontal direction HD1, which may be for example an X-axis direction, a second horizontal direction HD2, which may be for example a Y-axis direction, and a vertical direction VD, which may be for example a Z-axis direction. In some example embodiments, the memory blocks BLK1 to BLKz are selected by the address decoder 450 in FIG. 5. For example, the address decoder 450 may select a memory block BLK corresponding to a block address among the memory blocks BLK1 to BLKz.

Figure 7:
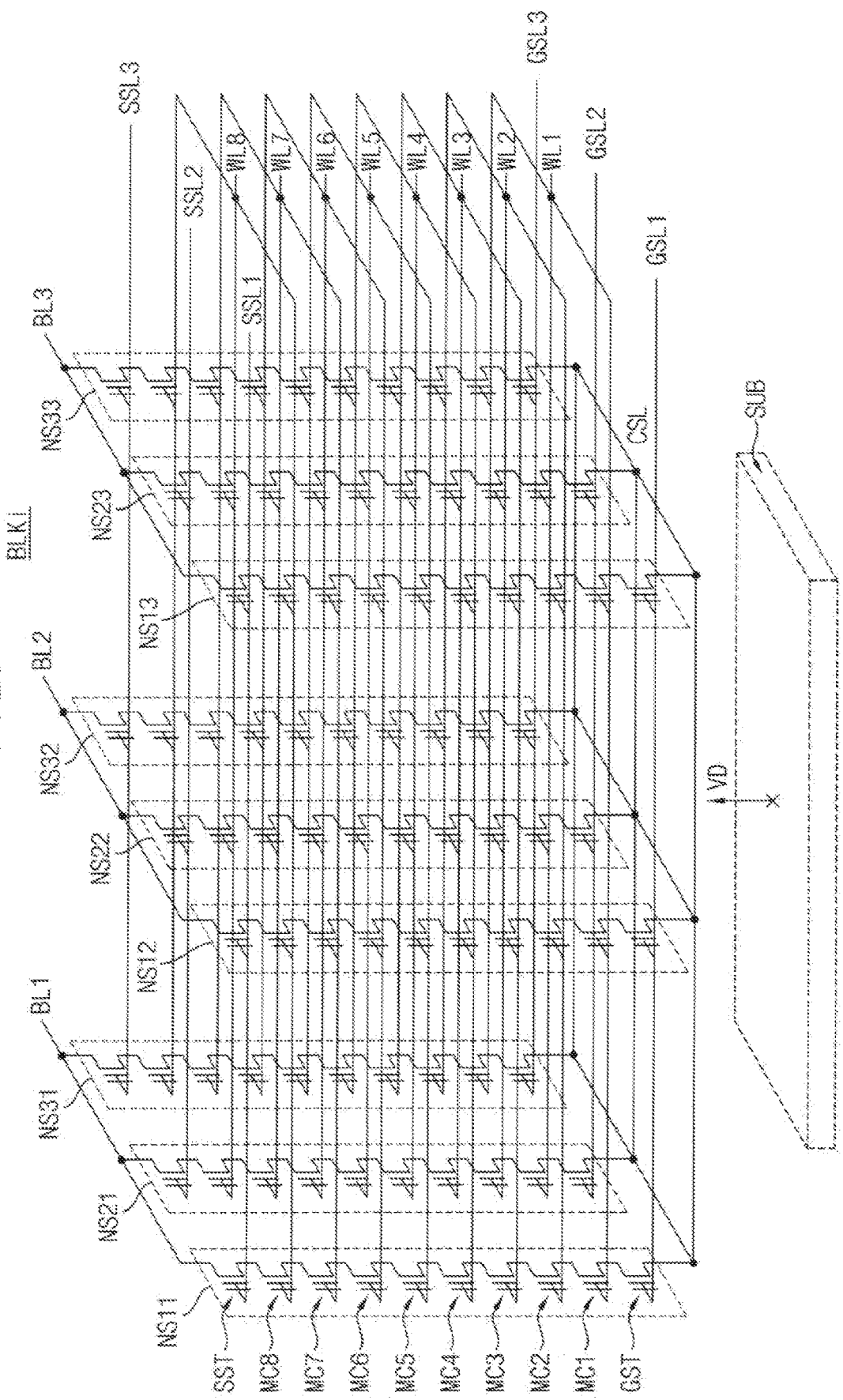
FIG. 7 is a circuit diagram illustrating one of the memory blocks of FIG. 6 according to an embodiment.

FIG. 7 is a circuit diagram illustrating one of the memory blocks of FIG. 6.

The memory block BLKi of FIG. 7 may be formed on a substrate SUB in a three-dimensional structure (or a vertical structure). For example, a plurality of memory cell strings included in the memory block BLKi may be formed in the vertical direction VD perpendicular to the substrate SUB.

Referring to FIG. 7, the memory block BLKi may include memory cell strings NS11 to NS33 coupled between bit-lines BL1, BL2 and BL3 and a common source line CSL.

Each of the memory cell strings NS11 to NS33 may include a string selection transistor SST, a plurality of memory cells MC1 to MC8, and a ground selection transistor GST. In FIG. 7, each of the memory cell strings NS11 to NS33 is illustrated to include eight memory cells MC1 to MC8. However, embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., word-line WL1) having the same height may be commonly connected, and the ground selection lines GSL1 to GSL3 and the string selection lines SSL1 to SSL3 may be separated. In FIG. 5, the memory block BLKi is illustrated to be coupled to eight word-lines WL1 to WL8 and three bit-lines BL1 to BL3. However, embodiments are not limited thereto. In some example embodiments, the memory cell array 420 may be coupled to any number of word-lines and bit-lines.

Figure 8:
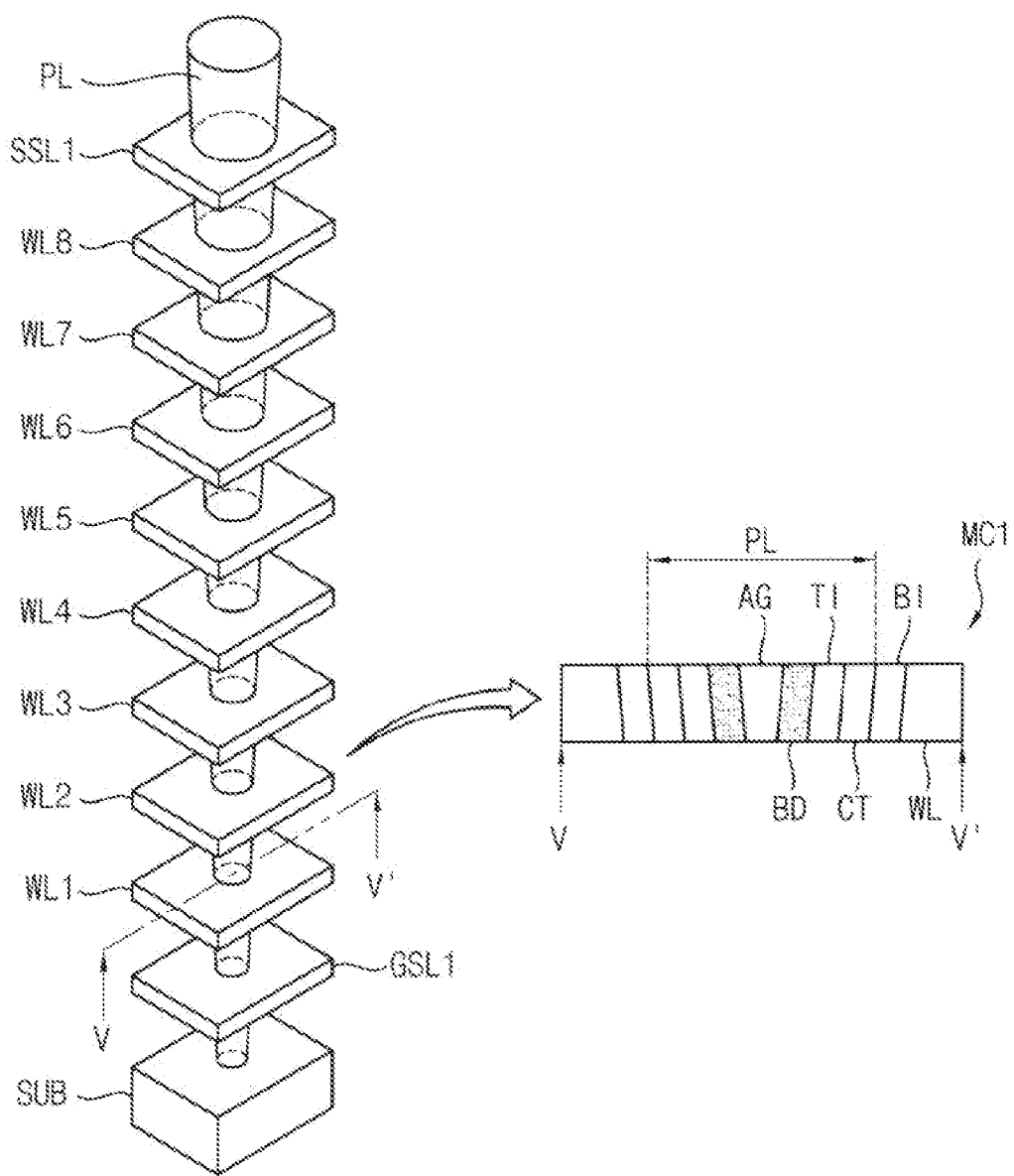
FIG. 8 illustrates an example of a structure of a cell string CS in the memory block of FIG. 7 according to an embodiment.

FIG. 8 illustrates an example of a structure of a cell string CS in the memory block of FIG. 7.

Referring to FIGS. 7 and 8, a pillar PL is provided on the substrate SUB such that the pillar PL extends in a direction perpendicular to the substrate SUB, for example a vertical direction VD, to make contact with the substrate SUB. Each of the ground selection line GSL, the word lines WL1 to WL8, and the string selection lines SSL illustrated in FIG. 18 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line V-V' is also illustrated in FIG. 8. In some example embodiments, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIG. 5, the control circuit 460 may receive a command signal including the command CMD and an address signal including the address ADDR from the storage controller 300, and may control an erase loop, a program loop and/or a read operation of the nonvolatile memory device 400a based on the command CMD and the address ADDR. The program loop may include a program operation and a program verification operation. The erase loop may include an erase operation and an erase verification operation.

For example, the control circuit 460 may generate control signals CTLs, which are used for controlling the voltage generator 470, based on at least one of the command signal and the command CMD, and generate a row address R_ADDR and a column address C_ADDR based on at least one of the address signal and the address signal ADDR. The control circuit 460 may provide the row address R_ADDR to the address decoder 450 and may provide the column address C_ADDR to the data I/O circuit 440.

The address decoder 450 may be coupled to the memory cell array 420 through the string selection line SSL, the plurality of word-lines WLs, and the ground selection line GSL. During the program operation or the read operation, the address decoder 450 may determine one of the plurality of word-lines WLs as a first word-line (e.g., a selected word-line) and determine rest of the plurality of word-lines WLs except for the first word-line as unselected word-lines based on the row address R_ADDR.

The voltage generator 470 may generate word-line voltages VWLs, which are required for the operation of the nonvolatile memory device 400a, based on the control signals CTLs. The voltage generator 470 may receive the power PWR1 from the storage controller 300. The word-line voltages VWLs may be applied to the plurality of word-lines WLs through the address decoder 450.

For example, during the erase operation, the voltage generator 470 may apply an erase voltage to a well of the memory block and may apply a ground voltage to entire word-lines of the memory block. During the erase verification operation, the voltage generator 470 may apply an erase verification voltage to the entire word-lines of the memory block or sequentially apply the erase verification voltage to word-lines in a word-line basis.

For example, during the program operation, the voltage generator 470 may apply a program voltage to the first word-line and may apply a program pass voltage to the unselected word-lines. In addition, during the program verification operation, the voltage generator 470 may apply a program verification voltage to the first word-line and may apply a verification pass voltage to the unselected word-lines.

Furthermore, during the read operation, the voltage generator 470 may apply a read voltage to the first word-line and may apply a read pass voltage to the unselected word-lines.

The page buffer circuit 430 may be coupled to the memory cell array 420 through the plurality of bit-lines BLs. The page buffer circuit 430 may include a plurality of page buffers. In some example embodiments, one page buffer may be connected to one bit-line. In some example embodiments, one page buffer may be connected to two or more bit-lines.

The page buffer circuit 430 may temporarily store data to be programmed in a selected page or data read out from the selected page.

The data I/O circuit 440 may be coupled to the page buffer circuit 430 through data lines DLs. During the program operation, the data I/O circuit 440 may receive the data DTA for example the write data WD, from the storage controller 300 provide the data DTA to the page buffer circuit 430 based on the column address C_ADDR received from the control circuit 460.

During the read operation, the data I/O circuit 440 may provide the data DTA for example the read data RD, which are stored in the page buffer circuit 430, to the storage controller 300 based on the column address C_ADDR received from the control circuit 460.

The control circuit 460 may control the page buffer circuit 430 and data I/O circuit 440.

The control circuit 460 may include a status signal generator 465 and the status signal generator 465 may generate a status signal RnB indicating whether each of the program operation, the erase operation and the read operation is completed or and/or is in progress.

The storage controller 300 may determine idle state or busy state of each of the nonvolatile memory devices 400a to 400k based on the status signal RnB.

Figure 9:
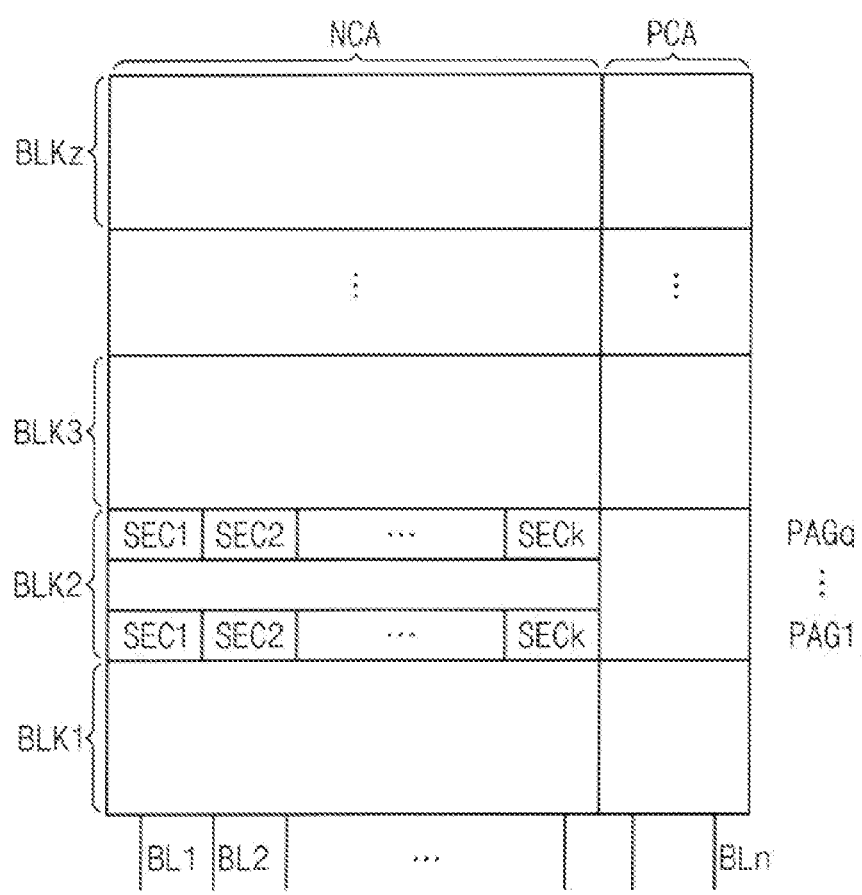
FIG. 9 is a block diagram illustrating an example of the memory cell array in the nonvolatile memory device of FIG. 5 according to an embodiment.

FIG. 9 is a block diagram illustrating an example of the memory cell array in the nonvolatile memory device of FIG. 5 according to example embodiments.

Referring to FIG. 9, a memory cell array 420 may include a plurality of memory blocks BLK1 to BLKz. Each of the plurality of memory blocks BLK1 to BLKz may include a plurality of pages PAG1 to PAGq (where q is an integer equal to or greater than 2).

The memory cell array 420 may include a normal cell region NCA to store the user data DTA and a parity cell region PCA to store parity bits.

Memory cells of the normal cell region NCA and the parity cell region PCA may be coupled to first bit-lines BL1 to BLn (n is an integer equal to or greater than 4). Each of the pages in the normal cell region NCA and the parity cell region PCA may include a plurality of sectors SEC1 through SECk (k is an integer equal to or greater than 3).

Figure 10:
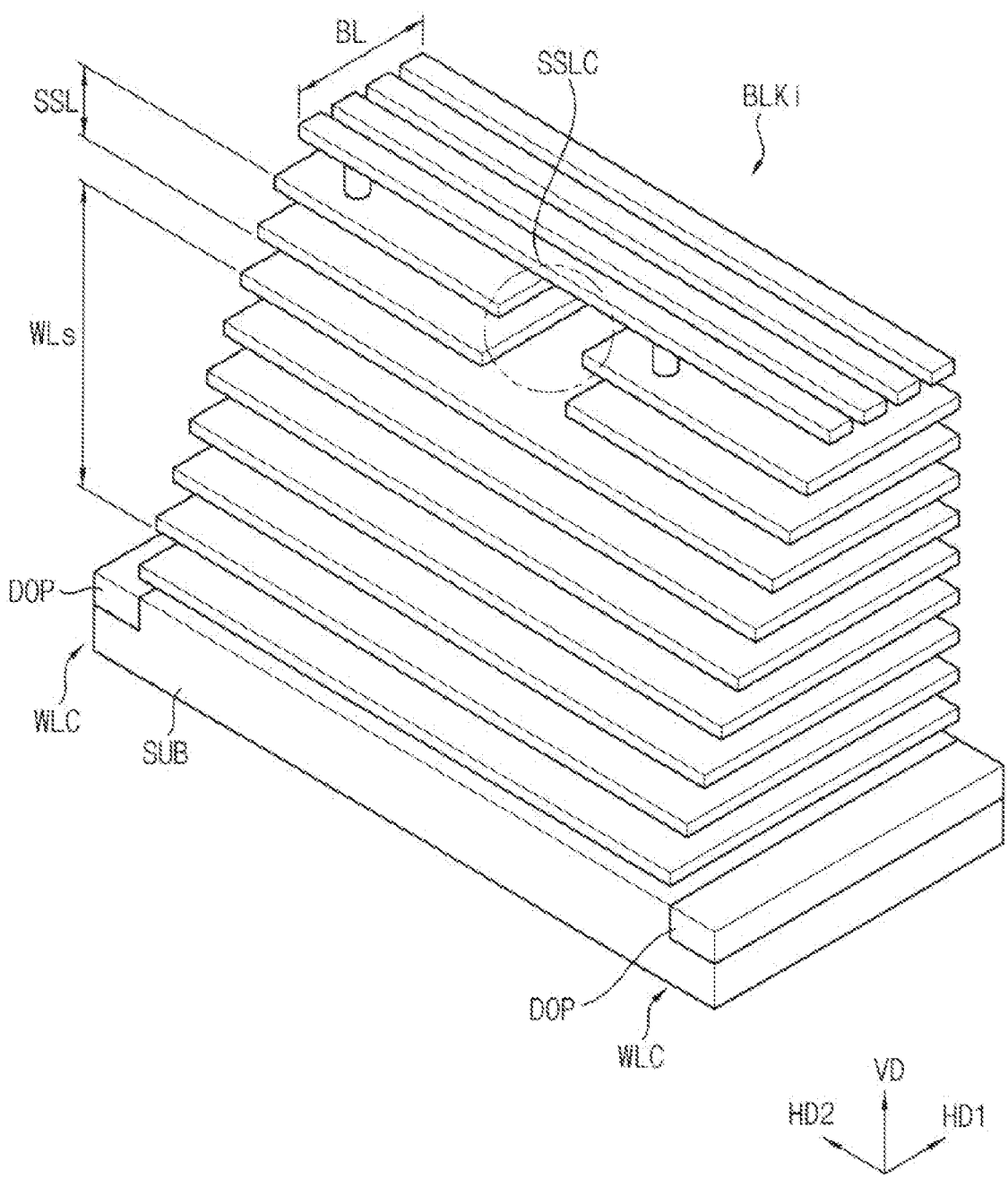
FIG. 10 is a perspective view illustrating one of the memory blocks in FIG. 6, according to an embodiment.
Figure 11A:
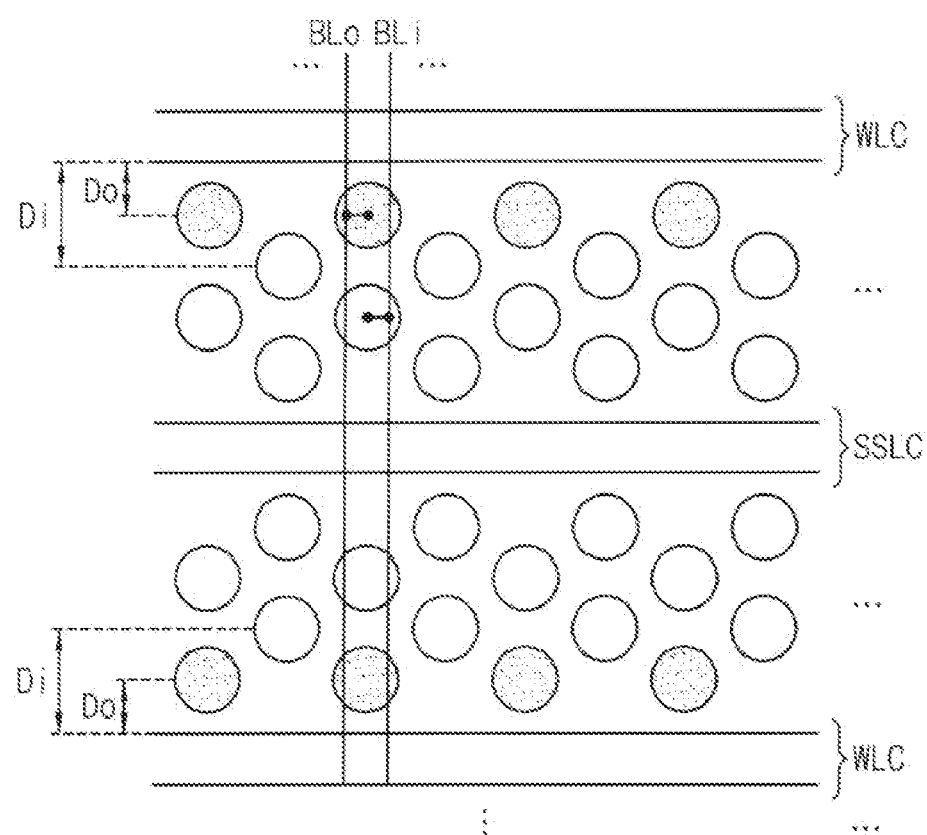
FIGS. 11A through 11C are top views of examples of the memory block of FIG. 10, respectively, according to embodiments.
Figure 11B:
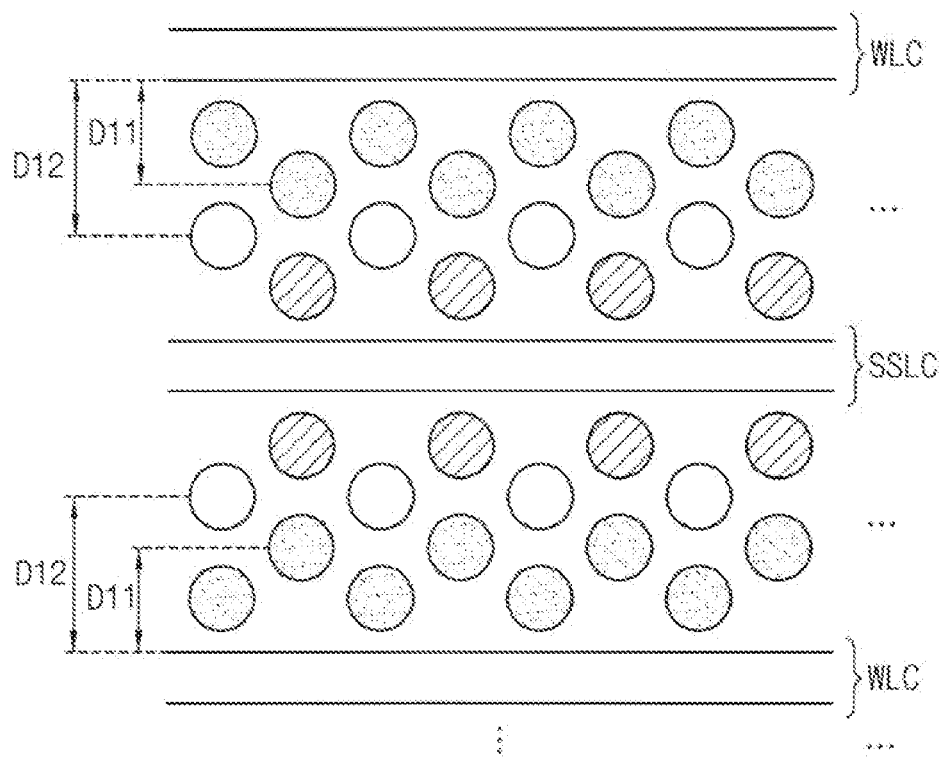
Figure 11C:
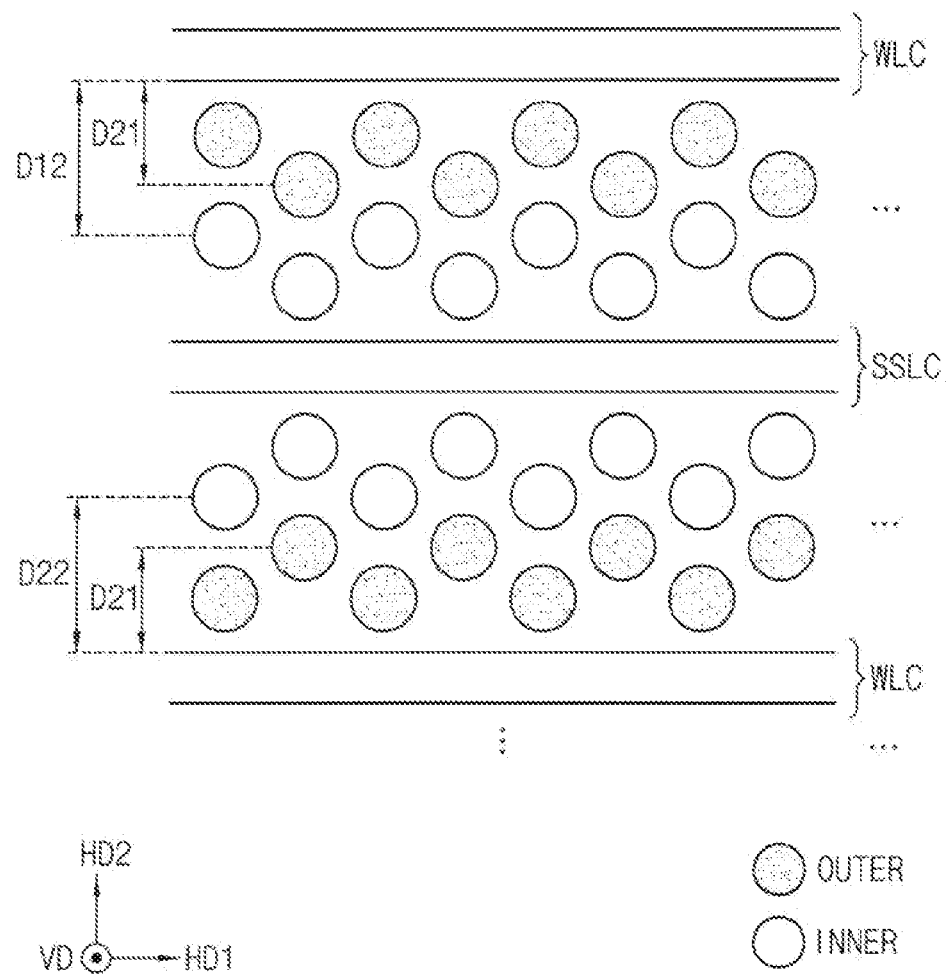

FIG. 10 is a perspective view illustrating one of the memory blocks in FIG. 6. and FIGS. 11A-11C are top views of examples of the memory block of FIG. 10.

Referring to FIG. 10, the memory block BLKi may be implemented such that at least one ground selection line GSL, a plurality of word-lines WLs and at least one string selection line SSL are stacked on a substrate between word-line cut regions WLC. Doping regions DOP may be formed in top portions of the substrate of the word-line cut regions WLC. The doping region may be used as common source lines CSL or common source nodes CSN to which a common source voltage is applied. The at least one string selection line SSL may be divided by a string selection line cut region SSLC extending in the first horizontal direction HD1.

A plurality of vertical channels or channel holes penetrate the at least one ground selection lines GSL, the plurality of word-lines WLs and the at least one string selection lines SSL. The at least one ground selection lines GSL, the plurality of word-lines WL and the at least one string selection lines SSL may be formed in the shape of planks. Bit-lines BL are connected to top surfaces of the channel holes.

Figure 12:
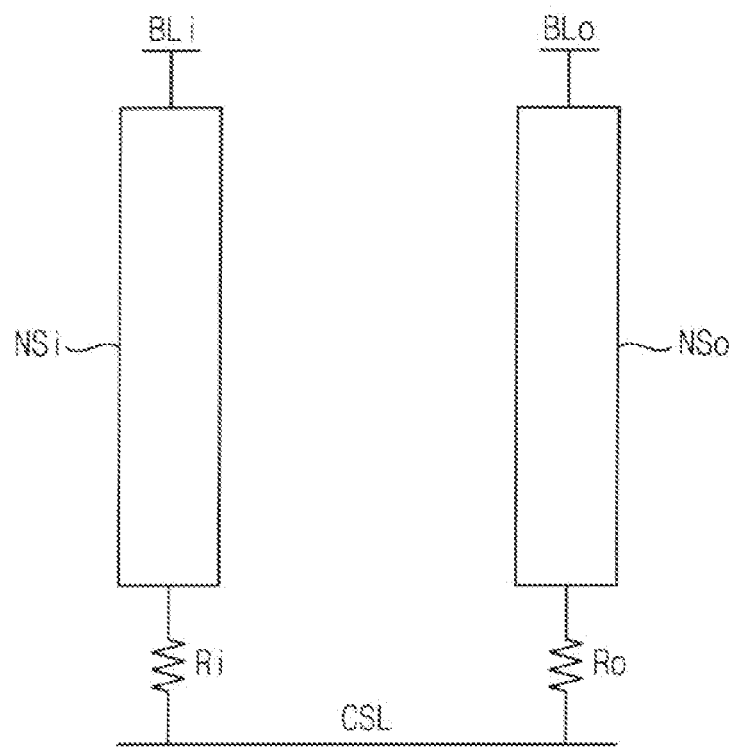
FIG. 12 is a circuit diagram illustrating connection relationship of NAND strings in the memory block in FIG. 11A according to an embodiment.

FIGS. 11A through 11C are top views of examples of the memory block of FIG. 10, respectively and FIG. 12 is a circuit diagram illustrating connection relationship of NAND strings in the memory block in FIG. 11A.

In FIG. 11A, dotted circles represent inner cells or inner channel holes and white circuits represent outer cells or outer channel holes. The common source lines corresponding to the doping region DOP in FIG. 9 are disposed in the word-line cut regions WLC.

Referring to FIG. 11A, the channel holes may be formed in a zig-zag structure in the memory block BLKi. Through the zig-zag structure, the area of the memory block BLKi may be reduced. Outer channel holes and inner channel holes are disposed in the second horizontal direction HD2 between the adjacent two word-line cut regions WLC in the memory block BLKi. One of the inner channel holes and the outer channel holes may be connected to even-numbered bit-line and the other may be connected to odd-numbered bit-line. For convenience of illustration, only one bit-line pair BLo and BLi are illustrated and the other bit-lines are omitted in FIG. 11A.

As illustrated in FIG. 11A, the outer cells may be formed in the outer channel holes and the inner cells may be formed on the inner channel holes where a distance Do between the outer channel hole and the word-line cut region WLC is smaller than a distance Di between the inner channel hole and the word-line cut region WLC.

Referring to FIG. 12, an inner NAND string NSi is formed in the inner channel hole and an outer NAND string NSo is formed in the outer channel hole. One end of the inner NAND string NSi is connected to the inner bit-line BLi and the other end of the inner NAND string NSi is connected to the common source line CSL through an inner resistor Ri. One end of the outer NAND string NSo is connected to the outer bit-line BLo and the other end of the outer NAND string NSo is connected to the common source line CSL through an outer resistor Ro.

Because the distance Do between the outer channel hole and the word-line cut region WLC is smaller than a distance Di between the inner channel hole and the word-line cut region WLC as illustrated in FIG. 11A, the resistance value of the inner resistor Ri is greater than the resistance value of the outer resistor Ro.

As such, the inner NAND string NSi and the outer NAND string NSo may be connected to the common source line CSL through the resistors Ri and Ro of the different resistance values. The inner cells in the inner NAND string NSi and the outer cells in the outer NAND string NSo may have different electrical characteristics due to the asymmetric connection structure of the inner NAND string NSi and the outer NAND string NSo. Such different electrical characteristics may result in the difference in the error bit levels. That is, a probability of error occurrence in the outer cells which is closer to the word-line cut region WLC than the inner cells is greater than a probability of error occurrence in the inner cells.

Referring to FIG. 11B, the storage controller 300 of FIG. 3 may divide a plurality of memory cells in a memory block into outer cells disposed within a first distance D11 from the word-line cut region WLC, inner cells disposed out of the first distance D11 and within a second distance D12 and mid cells disposed between the inner cells based on a distance from the word-line cut region WLC.

The ECC decoder 520 may perform the ECC decoding operation by applying different LLR values to outer cell bits read from the outer cells, inner cell bits read from the inner cells and mid cell bits read from the mid cells. For example, the ECC decoder 520 may perform the ECC decoding operation by applying a first LLR value to one or more outer cell bits, applying a second LLR value to one or more inner cell bits, and applying a third LLR value to one or more mid cell bits, and the first LLR value, the second LLR value, and the third LLR value may be different from each other.

Referring to FIG. 11C, the storage controller 300 of FIG. 3 may divide a plurality of memory cells in a memory block into outer cells disposed within a first distance D21 from the word-line cut region WLC and inner cells disposed out of the first distance D21 and within a second distance D22 based on a distance from the word-line cut region WLC. The storage controller 300 may further divide each of the outer cells and the inner cells into at least two groups based on the distance from the word-line cut region WLC. The ECC decoder 520 may perform the ECC decoding operation by applying different LLR values to bits read from groups of the outer cells and bits read from groups of the inner cells.

Figure 13A:
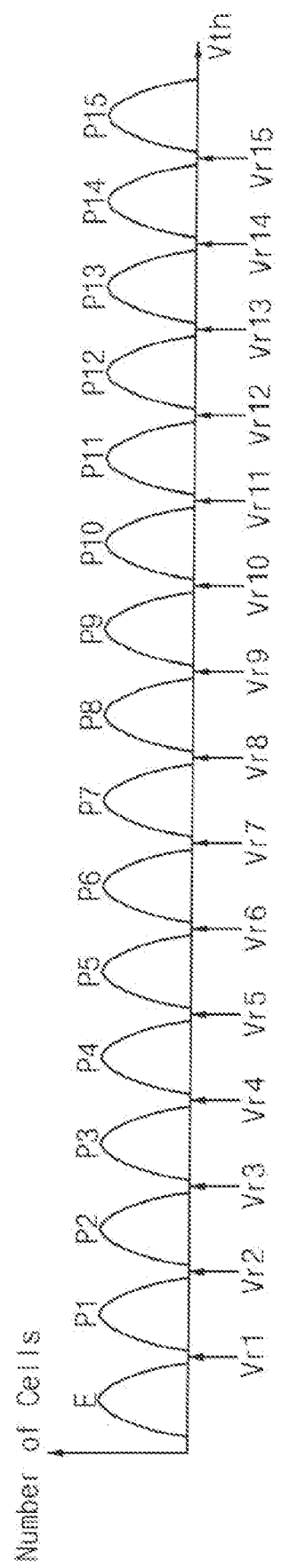
FIG. 13A is a graph showing a threshold voltage distribution of memory cells when a memory cell included in the memory cell array in FIG. 5 is a 4-bit quadrature level cell (QLC) according to an embodiment.

FIG. 13A is a graph showing a threshold voltage distribution of memory cells when a memory cell included in the memory cell array in FIG. 5 is a 4-bit quadrature level cell (QLC).

Referring to FIG. 13A, a horizontal axis represents a threshold voltage Vth and the vertical axis represents the number of memory cells. When each of the memory cells is a 4-bit quadrature level cell programmed to store 4 bits, the memory cell may have one from among an erase state E and first through fifteenth program states P1 through P15. When a memory cell is a multi-level cell, unlike a single-level cell, because an interval between threshold voltages distributions is small, a small change in the threshold voltage Vth may cause a large problem.

A first read voltage Vr1 has a voltage level between a distribution of a memory cell having the erase state E and a distribution of a memory cell having the first program state P1. Each of second through fifteenth read voltages Vr2 through Vr15 have a voltage level between distributions of memory cells having adjacent program states.

In example embodiments, assuming that the first read voltage Vr1 is applied, when a memory cell is turned on, data '1' may be stored, and when the memory cell is turned off, data '0' may be stored. However, embodiments are not limited thereto. For example, in embodiments, assuming that the first read voltage Vr1 is applied, when a memory cell is turned on, data '0' may be stored, and when the memory cell is turned off, data '1' may be stored. As such, a logic level of data may vary according to embodiments.

Figure 13B:
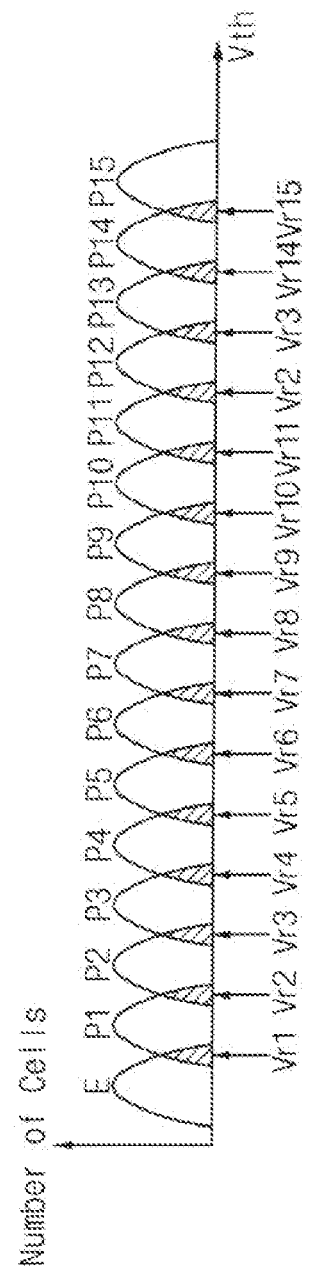
FIG. 13B and FIG. 13C are graphs showing cases where a threshold voltage of memory cells in the graph of FIG. 13A is changed, respectively, according to embodiments.
Figure 13C:
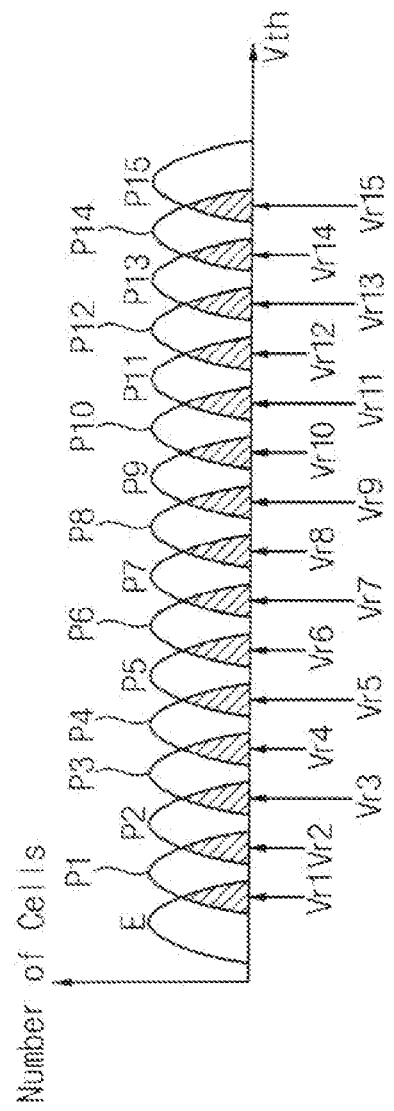

FIG. 13B and FIG. 13C are graphs showing examples in which a threshold voltage of memory cells in the graph of FIG. 13A is changed, respectively.

FIG. 13B shows that a threshold voltage of inner cells is changed and FIG. 13C shows that a threshold voltage of outer cells is changed.

Referring to FIGS. 13B and 13C, memory cells respectively programmed to the erase state E and the first through fifteenth program states P1 through P15 may have a changed distribution as shown in FIGS. 13B and 13C according to a read environment. In FIGS. 13B and 13C, memory cells belonging to hatched portions may have read errors, thereby reducing the reliability of a nonvolatile memory device. A number of read errors in FIG. 13C may be larger than a number of read errors in FIG. 13B.

For example, when a read operation is performed on a memory device by using the first read voltage Vr1, although memory cells included in a hatched portion are programmed to the first program state P1, the memory cells may be determined to have the erase state E due to a decrease in the threshold voltage Vth. Accordingly, an error may occur in the read operation, thereby reducing the reliability of the nonvolatile memory device.

When data is read from the nonvolatile memory device 400a, a raw bit error rate (RBER) may vary according to a voltage level of a read voltage. An optimum or otherwise desirable voltage level of a read voltage may be determined according to a distribution pattern of the memory cells. Accordingly, as a distribution of the memory cells changes, an optimum or otherwise desirable voltage level of a read voltage needed to read data from the nonvolatile memory device may change.

Figures 13D, 14:
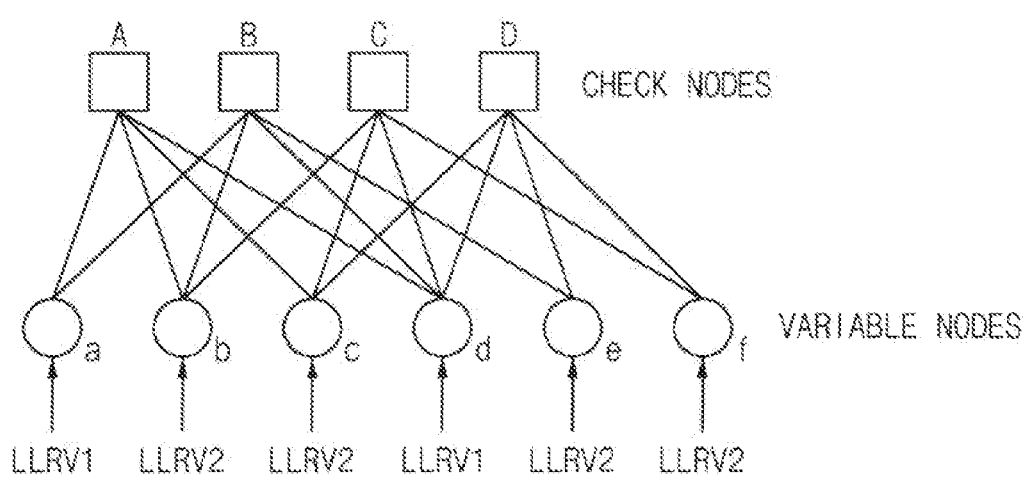
FIG. 13D illustrates a table for explaining bit mapping for programming memory cells according to an embodiment.
FIG. 14 shows an example of a Tanner graph for explaining an ECC decoding operation according to an embodiment.

FIG. 13D illustrates a table for explaining bit mapping for programming memory cells according to example embodiments.

For convenience of explanation, the present embodiment relates to a QLC memory cell. However, in other embodiments the memory cell may be a different type other than a QLC type.

Referring to FIG. 13D, when memory cells are QLCs, each of the memory cells may store a least significant bit (LSB), an extra significant bit (ESB), an upper significant bit (USB), and a most significant bit (MSB). Further referring to FIG. 8, LSBs stored in memory cells in a first row from among the memory cells connected to the word-line WL1 may form a first page, and MSBs stored therein may form a fourth page. USBs stored in the memory cells in the first row from among the memory cells connected to the word-line WL1 may form a third page, and ESB stored therein may form a second page.

FIG. 14 shows an example of a Tanner graph for explaining an ECC decoding operation according to example embodiments.

In embodiments, the ECC decoder 520 according to FIG. 4 and FIG. 14 may perform an ECC decoding operation based on a low-density parity check (LDPC) code, however embodiments are not limited thereto.

An LDPC code has an error correction capability near a channel capacity and is widely used in communication systems, communication standards, memory controllers, etc. The LDPC code is a linear block code that may be defined as a parity check matrix (PCM). Here, a code may refer to a relation between information and parity.

The LDPC code having a codeword length of n and an information length of k may be represented by the PCM having a size of (n-k)*n. In general, the LDPC code has a higher correction capability as the codeword length is long. The codeword may correspond to an ECC sector.

Referring to FIG. 14, the Tanner graph includes variable nodes a, b, c, d, e and f, check nodes A, B, C and D and edges connecting the variable nodes a, b, c, d, e and f and the check nodes A, B, C and D. The variable nodes a, b, c, d, e and f are related with codeword bits and the check nodes A, B, C and D are related with parity check constraints. The component "1" of the PCM corresponds to an edge of the Tanner graph. The number of the edges connected to each node is defined as a degree of the node.

The ECC decoder 520 may apply first LLR values LLRV1 to the variable nodes a and d and may apply second LLR values LLRV2 to the variable nodes b, c, e and f.

Figure 15:
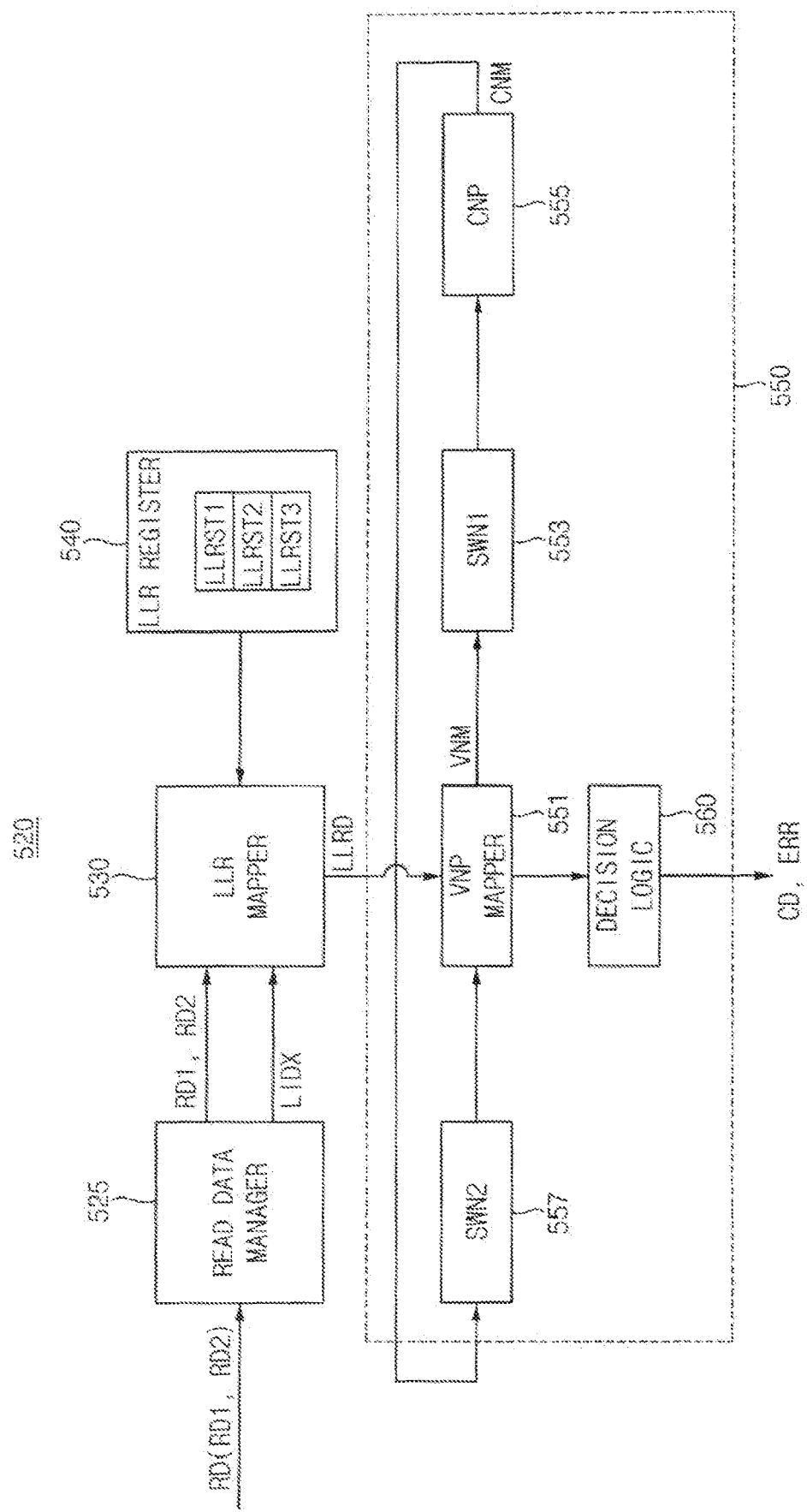
FIG. 15 is a block diagram illustrating an example of an ECC decoder according to an embodiment.

FIG. 15 is a block diagram illustrating an example of an ECC decoder according to example embodiments.

The nonvolatile memory device 400a may perform a read operation including a hard decision read operation and/or a soft decision read operation. The hard decision read operation is a read operation to read hard decision data from memory cells coupled to the target word-line based on on/off states of the memory cells by applying a default read voltage to the target word-line, the ECC decoder 520 may perform hard decision-type of error correction using the hard decision data and an ECC such as LDPC code. In addition, the soft decision read operation is a read operation to read soft decision data having reliability information on the hard decision data from memory cells coupled to the target word-line by applying a plurality of offset read voltages having regular gaps to the target word-line, the ECC decoder 520 may perform soft decision-type of error correction using the hard decision data, an ECC such as LDPC code and the reliability information on the hard decision data.

Referring to FIG. 15, the ECC decoder 520 may include a read data manager 525, an LLR mapper 530, an LLR register 540 and a decoder 550.

The read data manager 525 may receive and store read data RD read from a target page coupled to the target word-line and may provide the read data RD to the LLR mapper 530 by unit of an ECC sector. The read data manager 525 may provide the LLR mapper 530 with the location index LIDX of each of data bits in the read data RD.

The read data manager 525 may receive data read using a default read voltage from the target word-line and may store the received data as a first read data RD1. The read data manager 525 may receive data read using offset read voltages different from the default read voltage from the target word-line and may store the received data as a second read data RD2. The read data manager 525 may provide the first read data RD1 and the second read data RD2 to the LLR mapper 530 and may provide the location index LIDX along with the second read data RD2 to the LLR mapper 530.

The LLR register 540 may store a plurality sets of LLR values including a first set of LLR values LLRST1, a second set of LLR values LLRST2 and a third set of LLR values LLRST3, and may provide the plurality sets of LLR values to the LLR mapper 530.

In a soft decision decoding on the second read data RD2, the LLR mapper 530 may map the first set of LLR values LLRST1 and the second set of LLR values LLRST2 to the read data provided from the read data manager 525 by unit of an ECC sector to output an LLR data LLRD. The LLR mapper 530 may map the first set of LLR values LLRST1 to outer cell bits of the second read data RD2 and may map the second set of LLR values LLRST2 to inner cell bits of the second read data RD2.

In example embodiments, the LLR mapper 530 may map the third set of LLR values LLRST3 to mid cell bits of the second read data RD2.

The decoder 550 may update values of variable nodes and values of check nodes by performing node operation based on the LLR data LLRD and may output a decoded data CD or an error message ERR by performing a decoding on the LLR data LLRD based on the updated values of the variable nodes. The decoder 550 may output the decoded data CD in response to errors in the read data RD being corrected and the decoder 550 may output the error message ERR in response to at least one of errors in the read data RD being not corrected.

The decoder 550 may include a variable node processor VNP 551, a first switch network SWN1 553, a check node processor CNP 555, a second switch network SWN2 5574, and a decision logic 560, which may be for example a decision logic circuit.

During the LDPC decoding, a nonzero element in the parity check matrix means that a corresponding variable node and a corresponding check node are connected to each other. The decoding is performed through data transmitted according to the connection of the variable node and the check node.

The variable node processor VNP 551 may include the variable nodes a, b, c, d, e and f in FIG. 14, may store the LLR data LLRD and may provide the stored LLR data LLRD, as a variable node message VNM, to the first switch network 553. The check node processor CNP 555 may be connected to the variable node processor VNP 551 through the first switch network 553, may include the check nodes A, B, C and D in FIG. 14, may process values of the variable nodes with respect to each check node with reference to the variable node message VNM, and may provide a check node message CNM to the second switch network 557.

The variable node processor VNP 551 may be connected to the check node processor CNP 555 through the second switch network 557, may update values of the variable nodes with reference to the check node message CNM and may perform decoding on the LLR data LLRD according to the updated values of the variable nodes.

The decision logic 560 may correct the second read data RD based on a result of decoding to output the decoded data CD or the error message ERR in response to uncorrectable errors.

Figure 16:
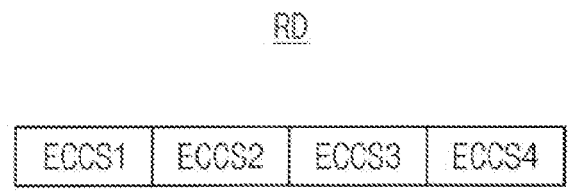
FIG. 16 illustrates an example of the read data in FIG. 15 according to an embodiment.

FIG. 16 illustrates an example of the read data in FIG. 15.

Referring to FIG. 16, the read data RD may include a first ECC sector ECCS1, a second ECC sector ECCS2, a third ECC sector ECCS3 and a fourth ECC sector ECCS4.

As described above, each of the first ECC sector ECCS1, the second ECC sector ECCS2, the third ECC sector ECCS3 and the fourth ECC sector ECCS4 may correspond to a unit of ECC operation.

Figure 17:
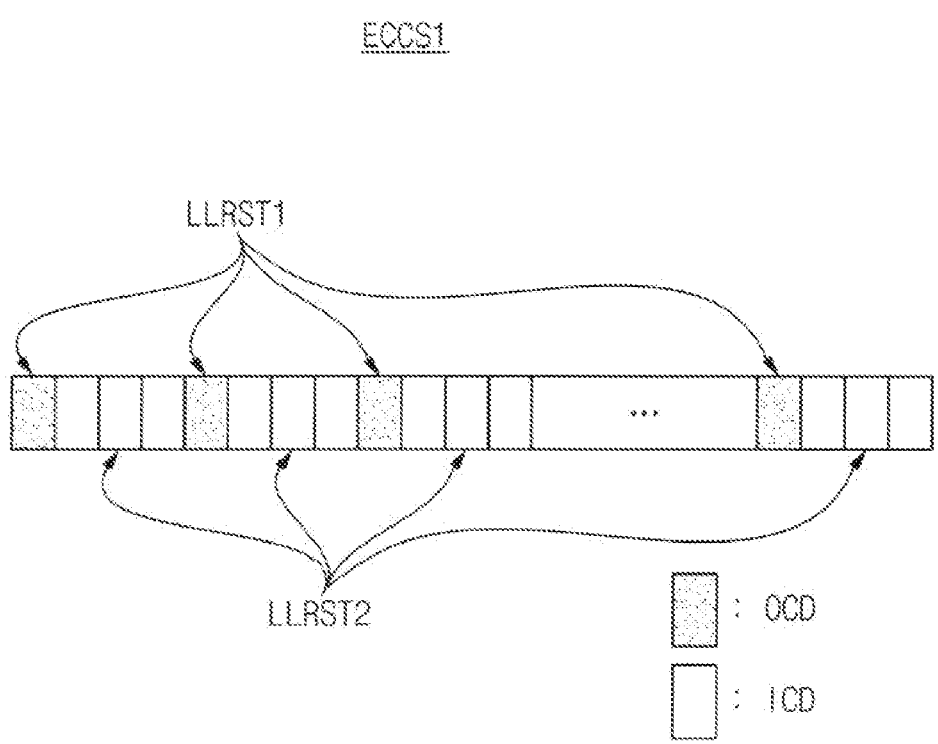
FIG. 17 illustrates an example of data bits in the first ECC sector in FIG. 16.

FIG. 17 illustrates an example of data bits in the first ECC sector in FIG. 16.

Referring to FIG. 17, the first ECC sector ECCS1 may include outer cell bits OCD, which may be for example first data bits, and inner cell bits ICD, which may be for example second data bits. The outer cell bits are read from the outer cells and the inner cell bits are read from the inner cells and a distance between the outer cells and the word-line cut region is smaller than a distance between the inner cells and the word-line cut region.

The ECC decoder 520 may apply the first set of LLR values LLRST1 to the outer cell bits OCD and may apply the second set of LLR values LLRST2 to the inner cell bits ICD.

Figure 18:
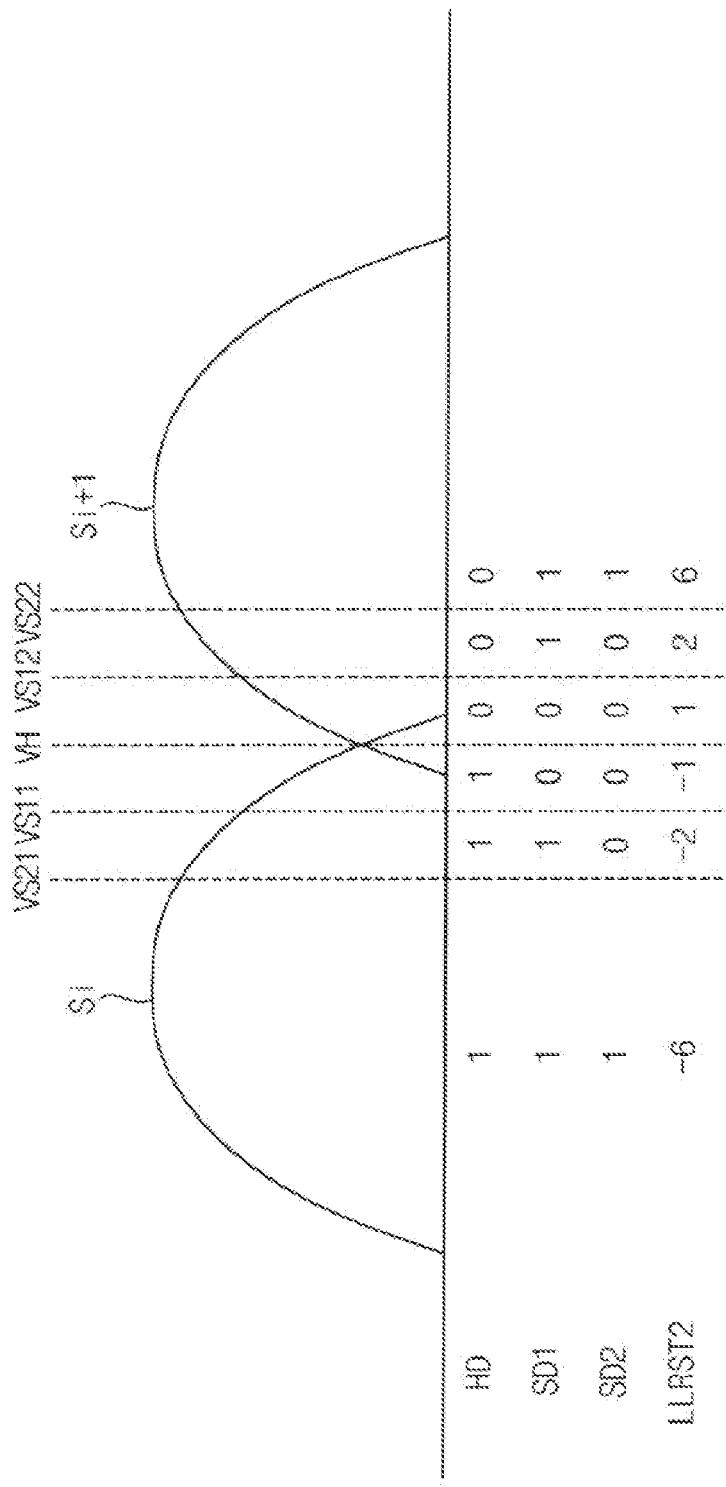
FIG. 18 illustrates that the ECC decoder performs an ECC decoding operation on data bits read from the inner cells according to an embodiment.
Figure 19:
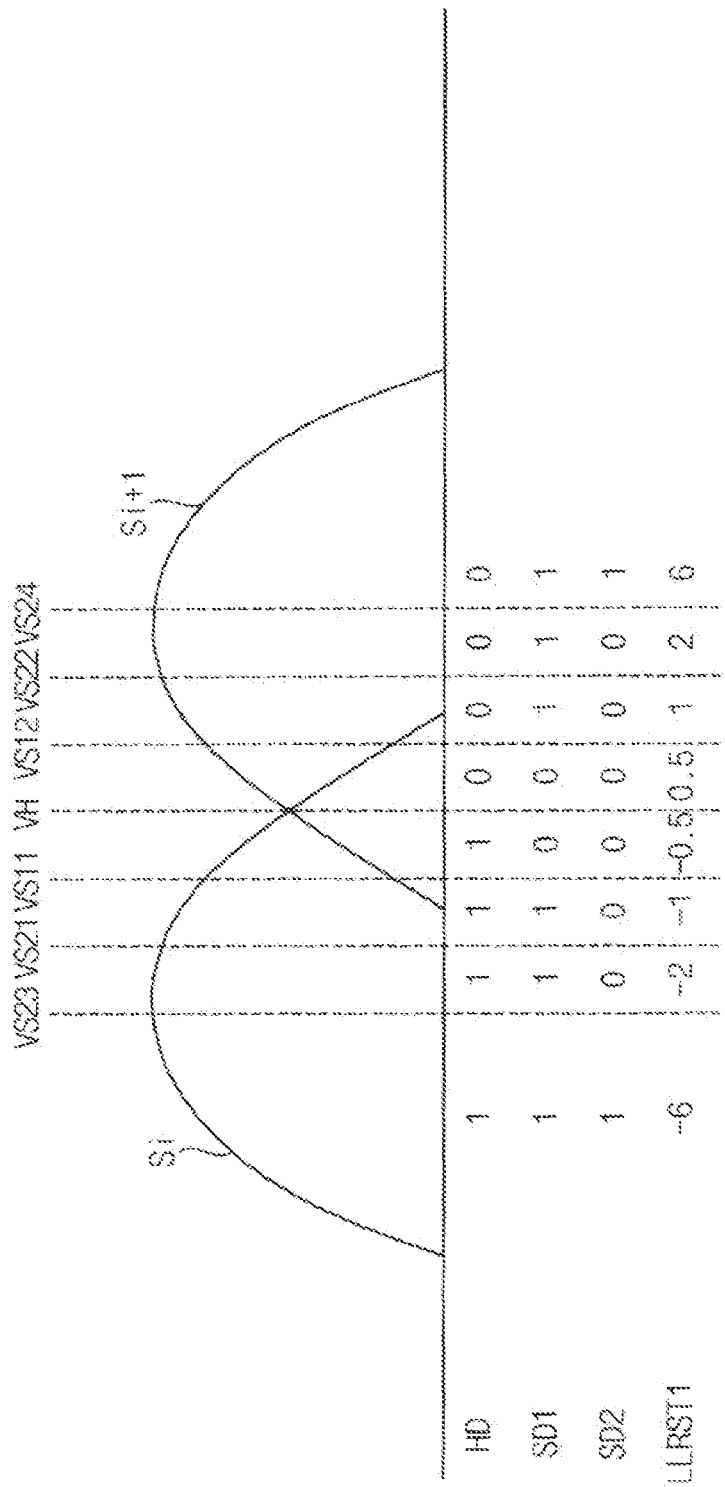
FIG. 19 illustrates that the ECC decoder performs an ECC decoding operation on data bits read from the outer cells according to an embodiment.

FIG. 18 illustrates an example in which the ECC decoder 520 performs an ECC decoding operation on data bits read from the inner cells, and FIG. 19 illustrates an example in which the ECC decoder 520 performs an ECC decoding operation on data bits read from the outer cells. In. FIGS. 18 and 19, the ECC decoder 520 performs a hard decision decoding HD and first and second soft decision decodings SD1 and SD2 for discriminating two adjacent states Si and Si+1 which are partially overlapped.

Referring to FIG. 18, the ECC decoder 520 may perform a hard decision decoding HD on the inner cell bits read from the inner cells using a default read voltage VH, and may perform a first soft decision decoding SD1 and a second soft decision decoding SD2 on the inner cell bits read from the inner cells using offset read voltages VS11, VS12, VS21 and VS22. A reliability of each of the inner cell bits on which the hard decision decoding HD is performed corresponds to '−6, −2, −1, 1, 2 and 6' which are determined by the second set of LLR values LLRST2.

Referring to FIG. 19, the ECC decoder 520 may perform a hard decision decoding HD on the outer cell bits read from the outer cells using the default read voltage VH, and may perform a first soft decision decoding SD1 and a second soft decision decoding SD2 on the inner cell bits read from the inner cells using offset read voltages VS11, VS12, VS21, VS22, VS23 and VS24. A reliability of each of the outer cell bits on which the hard decision decoding HD is performed corresponds to '−6, −2, −1, −0.5, 0.5, 1, 2 and 6' which are determined by the first set of LLR values LLRST1.

The ECC decoder 520 may apply different LLR values to the outer cell bits and the inner cell bits and may apply different LLR intervals to the outer cell bits and the inner cell bits. In addition, the processor 310 may control the ECC decoder 520 such that the ECC decoder 520 applies to a first LLR value to the outer cell bits and applies a second LLR value to the inner cell bits during the same LLR interval from among the different LLR intervals. An absolute value of the first LLR value is smaller than an absolute value of the second LLR value. That is, the processor 310 may control the ECC decoder 520 such that a reliability of the outer cell bits read from the outer cells having a higher probability of error occurrence is smaller than a reliability of the inner cell bits read from the inner cells having a lower probability of error occurrence.

Figure 20:
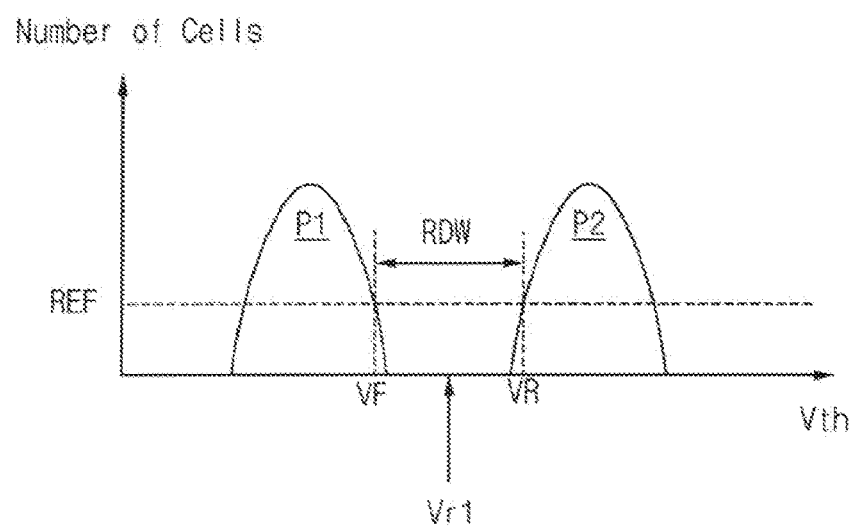
FIG. 20 is a graph showing enlarged first and second program states of FIG. 13A according to an embodiment.

FIG. 20 is a graph showing enlarged first and second program states of FIG. 13A.

Referring to FIG. 20, a read window RDW between the first and second program states P1 and P2 may be defined as a difference between a fall voltage VF corresponding to the first program state P1 and a rise voltage VR corresponding to the second program state P2. Here, the fall voltage VF may represent a threshold voltage where the number of "off" cells corresponds to a reference number REF, based on an "off" cell count result for memory cells programmed to the first program state P1. The rise voltage VR may represent a threshold voltage where the number of "off" cells corresponds to the reference number REF, based on an "off" cell count result for memory cells programmed to the second program state P2. A read voltage Vr2 for determining the second program state P2 should have a voltage level within the read window RWD, and in order to decrease a read error, the read window RWD should be sufficiently widely secured.

Figure 21:
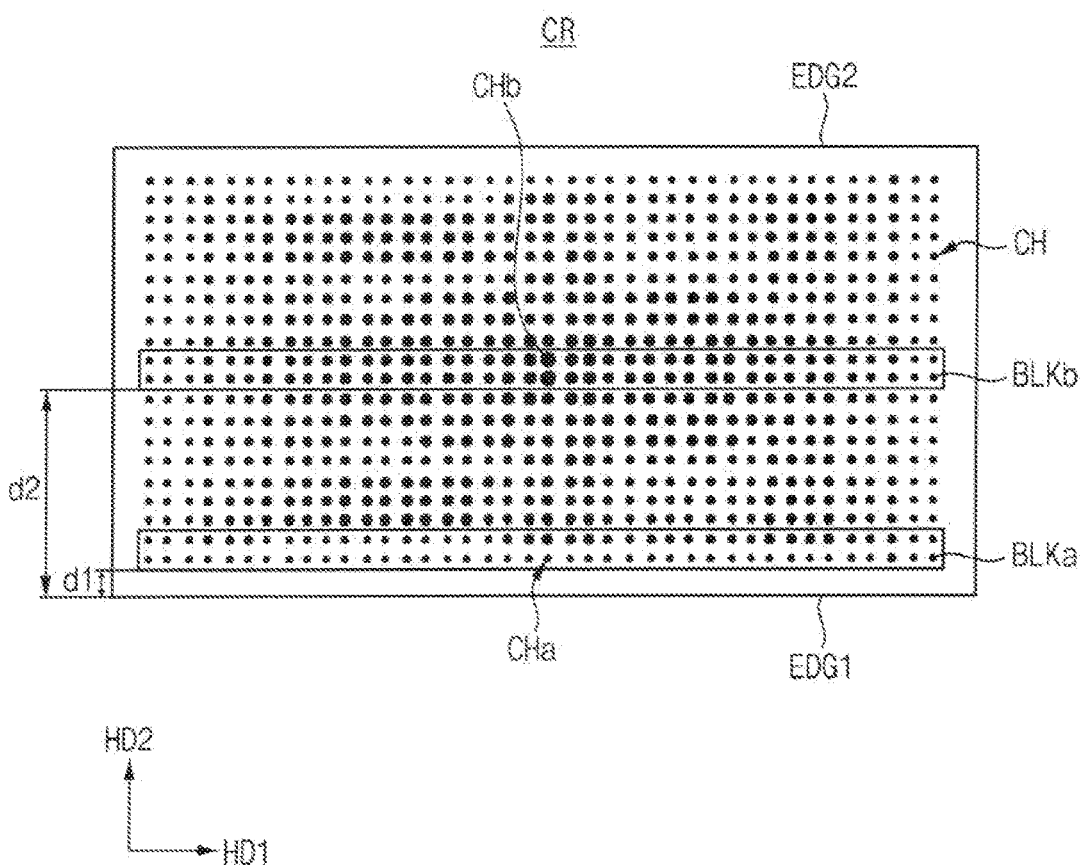
FIG. 21 illustrates a cell region in which the memory cell array of FIG. 6 is formed according to an embodiment.

FIG. 21 illustrates a cell region in which the memory cell array of FIG. 6 is formed according to example embodiments.

Referring to FIG. 21, a cell region CR includes a plurality of channel holes CH.

A channel hole size, for example, a channel hole diameter, may be varied according to positions within the cell region CR. For example, channel holes CH adjacent to the first and second edges EDG1 and EDG2 have a low peripheral density, and thus may have a different diameter from those of other channel holes CH. A memory block BLKa may be adjacent to the second edge EDG2, and may be spaced apart from the second edge EDG2 by a first distance d1. A memory block BLKb may not be adjacent to the first and second edges EDG1 and EDG2, and be in a center of the cell region CR, and may be spaced apart from the second edge EDG2 by a second distance d2. The second distance d2 may be greater than the first distance d1. A first diameter D1 of a first channel hole CHa included in the memory block BLKa may be smaller than a second diameter D2 of a second channel hole CHb included in the memory block BLKb.

Figure 22A:
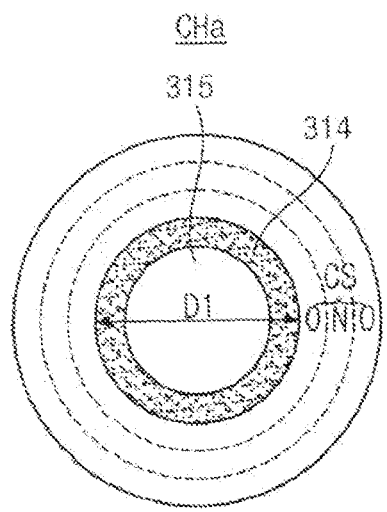
FIGS. 22A and 22B illustrate cross-sections of strings of the memory blocks BLKa and BLKb of FIG. 21, respectively, according to embodiments.
Figure 22B:
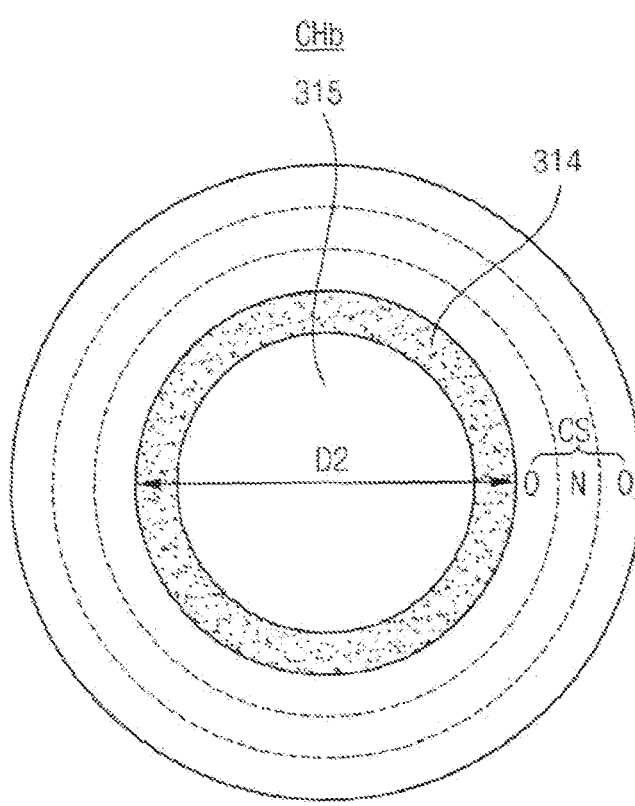

FIGS. 22A and 22B illustrate cross-sections of strings of the memory blocks BLKa and BLKb of FIG. 21, respectively.

Referring to FIG. 22A, a pillar including a channel layer 314 and an internal layer 315 may be formed in the first channel hole CHa included in the memory block BLKa, and a charge storage layer CS may be formed around the first channel hole CHa, and the charge storage layer CS may have an (oxide-nitride-oxide) ONO structure.

Referring to FIG. 22B, a pillar including a channel layer 314 and an internal layer 315 may be formed in the second channel hole CHb included in the memory block BLKb, and a charge storage layer CS may be formed around the second channel hole CHb, and the charge storage layer CS may have an ONO structure.

In an example embodiment, a thickness of the charge storage layer CS included in the memory block BLKb may be different from a thickness of the charge storage layer CS included in the memory block BLKa. Characteristics of memory cells may vary due to the difference in the channel hole diameters. For example, in a NAND flash nonvolatile memory device having a gate all around structure in which a gate electrode is disposed around a circumference of a channel hole, if a channel hole diameter is reduced, the magnitude of an electric field formed between a gate electrode and a channel layer 314 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 21, a memory block is formed in the cell region CR to include all memory cells corresponding to one page in the first horizontal direction HD1, that is, in a word-line direction, and to include some strings in the second horizontal direction HD2, that is, in a bit-line direction. Thus, each memory block extends in the first horizontal direction HD1, and channel hole sizes, that is, channel hole diameters may differ in units of memory blocks. Thus, program and erase speeds of memory cells included in the memory block BLKa may be higher than program and erase speeds of memory cells included in the memory block BLKb.

Figure 23:
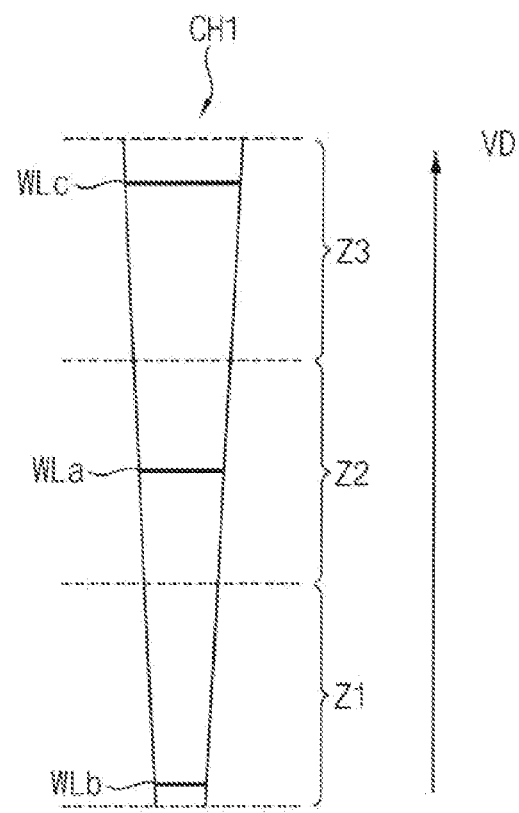
FIG. 23 illustrates an example of a vertical structure of one of channel holes in FIG. 21 according to an embodiment.

FIG. 23 illustrates an example of a vertical structure of one of channel holes in FIG. 21.

Referring to FIG. 23, a channel hole CH1 corresponding to a string included in a nonvolatile memory device is illustrated. As described above, the channel hole CH1 is formed by etching portions of gate electrodes and insulation layers stacked on a substrate, and thus, the channel hole CH1 may be a tapered etching profile where a diameter of the channel hole CH1 is becoming downwardly smaller. Thus, a diameter of the channel hole CH1 may be smaller towards the substrate.

In an example embodiment, the channel hole CH1 may be divided into three zones according to channel hole diameters. For example, a zone in which a channel hole diameter is smaller than a first value may be referred to as a first zone Z1, and a zone in which a channel hole diameter is equal to or greater than the first value and smaller than a second value may be referred to as a second zone Z2, and a zone in which a channel hole diameter is equal to or greater than the second value and smaller than a third value may be referred to as a third zone Z3. Therefore, characteristics of memory cells included in one channel hole may be different according to positions along the vertical direction VD.

A word-line WLb is provided in the first zone Z1, a word-line WLa is provided in the second zone Z2, and a word-line WLc is provided in the third zone Z3. Because the word-line WLb is adjacent to a lower edge of the channel hole CH1, the word-line WLb is adjacent to a ground selection line or the substrate, a probability of bridge occurring between the word-line WLb and the channel. When the bridge occurs between the word-line WLb and the channel, a current leakage may occur through the bridge and program/read operation and erase operation may operate abnormally in the word-line WLb due to the bridge.

Because the word-line WLc is adjacent to an upper edge of the channel hole CH1, the word-line WLc is adjacent to a string selection line or the substrate, a probability of bridge occurring between the word-line WLc and the channel.

Error occurrence probability of pages coupled to the word-line WLc which is adjacent to an upper edge of the channel hole CH1 or coupled to the word-line WLb which is adjacent to the lower edge of the channel hole CH1 may be greater than error occurrence probability of pages coupled to the word-line WLa which is disposed at a center region of the channel hole CH1.

FIGS. 20 through 23 relate to embodiments in which an error attribute of the target page may be different based on a location of the target word-line and an error occurrence probability of the target page may be different based on the error attribute.

The processor 310 in the storage controller 300 according to example embodiments, may apply different location indices to the plurality of NAND strings, respectively. In addition, the processor 310 may apply the same location index to at least two NAND strings sharing a same channel hole from among the plurality of channel holes, from among the plurality of NAND strings. In addition, the processor 310 may apply individual location indices to the plurality of memory blocks, respectively. In addition, the processor 310 may apply the location index to at least one word-line or a portion of word-lines including the inner cells and outer cells having difference of error occurrence probability.

Figure 24:
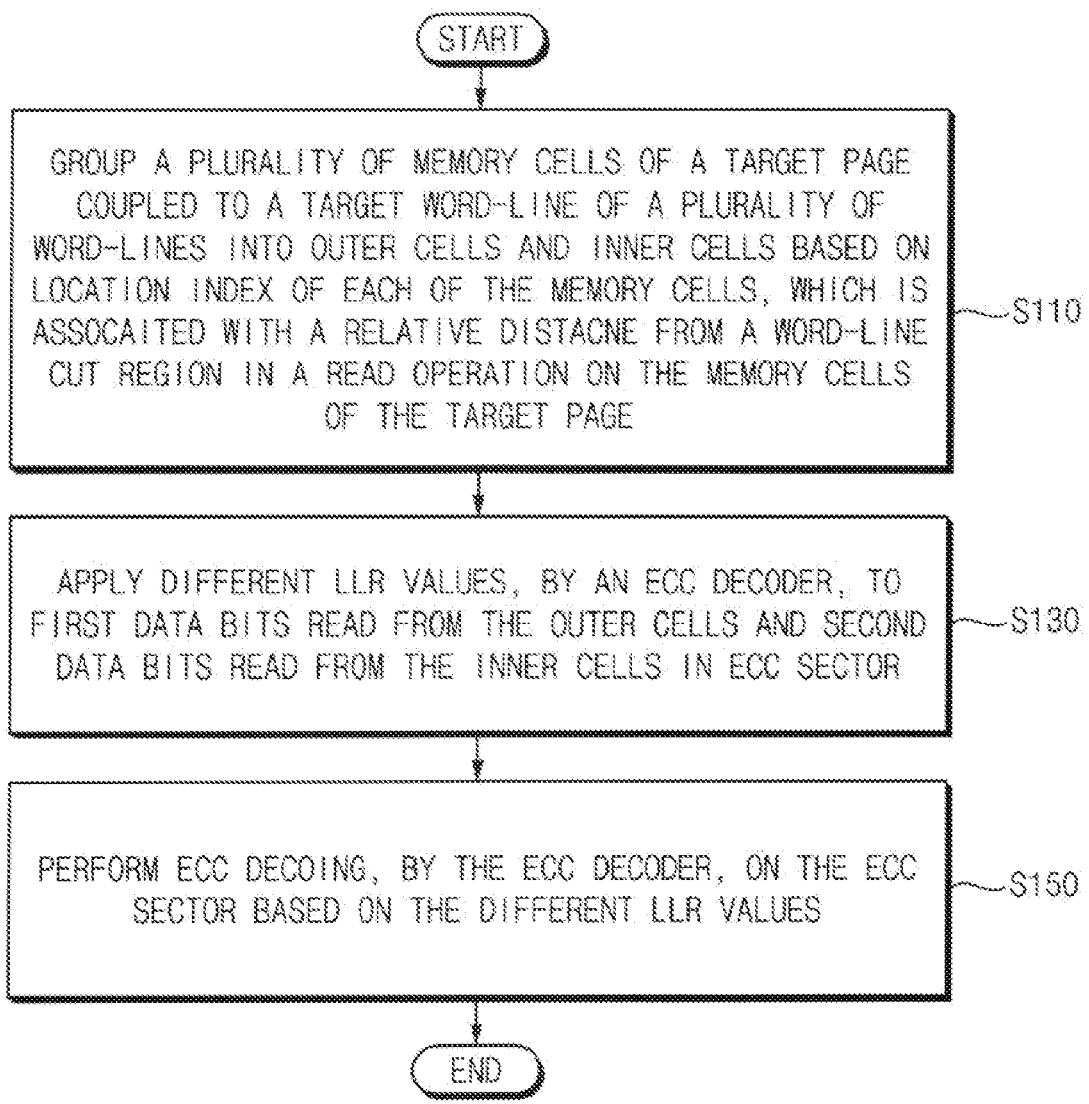
FIG. 24 is a flow chart illustrating a method of operating a storage device according to an embodiment.

FIG. 24 is a flow chart illustrating a method of operating a storage device according to example embodiments.

Referring to FIGS. 3 through 24, there is provided a method of operating a storage device 200 including a nonvolatile memory device 400a which includes a memory cell array and a storage controller 300 to control the nonvolatile memory device 400a, where the memory cell array includes a plurality of word-lines stacked on a substrate, a plurality of memory cells provided in a plurality of channel holes extending in a vertical direction with respect to the substrate and a word-line cut region extending in a first horizontal direction and dividing the plurality of word-lines into a plurality of memory blocks.

According to the method, at operation S110 the storage controller 300 divides a plurality of target memory cells coupled to a target word-line into outer cells and inner cells based on a location index of each of the target memory cells in which a distance between the outer cell and the word-line cut region is smaller than a distance between the inner cell and the word-line cut region, in a read operation on the plurality of target memory cells (operation S110).

At operation S130, an ECC decoder 520 in the storage controller 300 applies different LLR values to outer cell bits and inner cell bits in which the outer cell bits are read from the outer cells in an ECC sector, the inner cell bits are read from the inner cells in the ECC sector and the ECC sector corresponds to a unit of an ECC operation.

At operation S150, the ECC decoder 520 performs an ECC decoding operation on an ECC sector based on the different LLR values.

In example embodiments, for applying the different LLR values, an LLR mapper 530 in the ECC decoder 520 applies a first set of LLR values LLRST1 to the outer cell bits and applies a second set of LLR values LLRST2 to the inner cell bits.

Therefore, in the storage device and the method of operating the storage device, the storage controller divides a plurality of target memory cells coupled to a target word-line into outer cells and inner cells based on a location index of each of the target memory cells, and the ECC decoder performs a soft decision decoding by applying different LLR values to outer cell bits read from the outer cells and inner cell bits read from the inner cells, during a read operation on the target page. The processor controls the ECC decoder such that a reliability of the outer cell bits read from the outer cells having a higher probability of error occurrence is smaller than a reliability of the inner cell bits read from the inner cells and thus may correct errors occurring in the outer cell bits efficiently.

Figure 25:
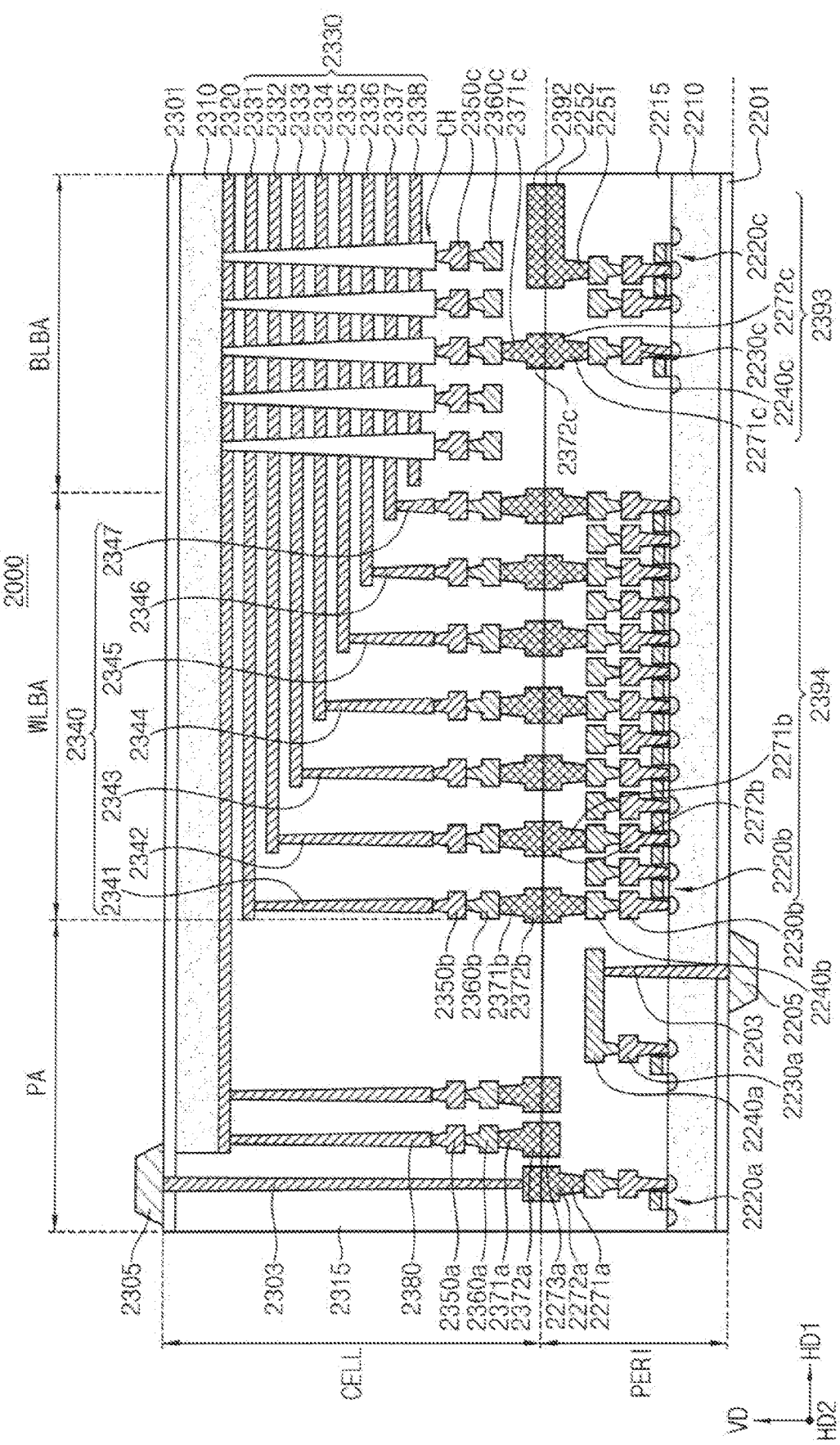
FIG. 25 is a cross-sectional view of a nonvolatile memory device according to an embodiment.

FIG. 25 is a cross-sectional view of a nonvolatile memory device according to example embodiments.

Referring to FIG. 25, a nonvolatile memory device 2000, which may be referred to as a memory device, may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrated in FIG. 23, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The least one memory block may include a first region and a second region. The first region may store compensation data set and may correspond to SLC block. The cell region CELL may include a second substrate 2310 and a common source line 2320. On the second substrate 2310, a plurality of word-lines 2330, which may include word-line 2331, word-line 2332, word-line 2333, word-line 2334, word-line 2335, word-line 2336, word-line 2337, and word-line 2338 may be stacked in a vertical direction VD (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer and a second metal layer. For example, the first metal layer may be a bit-line contact 2350c, and the second metal layer may be a bit-line 2360c. In an example embodiment, the bit-line 2360c may extend in a second horizontal direction HD2 (e.g., a Y-axis direction), parallel to the upper surface of the second substrate 2310.

In an example embodiment illustrated in FIG. 23, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer circuit 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer circuit 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2340, which may include cell contact plug 2341, cell contact plug 2342, cell contact plug 2343, cell contact plug 2344, cell contact plug 2345, cell contact plug 2346, and cell contact plug 2347. The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220*b* forming an address decoder 2394 in the peripheral circuit region PERI. In an example embodiment, operating voltages of the circuit elements 2220*b* forming the address decoder 2394 may be different than operating voltages of the circuit elements 2220*c* forming the page buffer circuit 2393. For example, operating voltages of the circuit elements 2220*c* forming the page buffer circuit 2393 may be greater than operating voltages of the circuit elements 2220*b* forming the address decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350*a* and a second metal layer 2360*a* may be stacked on an upper portion of the common source line contact plug 2380, sequentially. For example, an area in which the common source line contact plug 2380, the first metal layer 2350*a*, and the second metal layer 2360*a* are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220*a*, 2220*b*, and 2220*c* disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating film 2301. The second input/output pad 2305 may be connected to at least one of the plurality of circuit elements 2220*a*, 2220*b*, and 2220*c* disposed in the peripheral circuit region PERI through a second input/output contact plug 2303. In the example embodiment, the second input/output pad 2305 is electrically connected to a circuit element 2220*a*.

According to embodiments, the second substrate 2310 and the common source line 2320 may not be disposed in an area in which the second input/output contact plug 2303 is disposed. Also, the second input/output pad 2305 may not overlap the word-lines 2330 in the vertical direction HD. The second input/output contact plug 2303 may be separated from the second substrate 2310 in the direction, parallel to the upper surface of the second substrate 2310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. In embodiments, the storage device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273*a*, corresponding to an upper metal pattern 2372*a* formed in an uppermost metal layer of the cell region CELL, and having the same cross-sectional shape as the upper metal pattern 2372*a* of the cell region CELL so as to be connected to each other, in an uppermost metal layer of the peripheral circuit region PERI. In the external pad bonding area PA, the memory device 2000 may include lower bonding metals 2271*a* and 2271*b* connected to the lower metal pattern 2273*a*. In the peripheral circuit region PERI, the lower metal pattern 2273*a* formed in the uppermost metal layer of the peripheral circuit region PERI may not be connected to a contact. Similarly, in the external pad bonding area PA, an upper metal pattern 2372*a*, corresponding to the lower metal pattern 2273*a* formed in an uppermost metal layer of the peripheral circuit region PERI, and having the same shape as a lower metal pattern 2273*a* of the peripheral circuit region PERI, may be formed in an uppermost metal layer of the cell region CELL. Similarly, in the external pad bonding area PA, an upper bonding metal 2371*a* may be formed and may be electrically connected to the upper metal pattern 2372*a*.

The lower bonding metals 2271*b* and 2272*b* may be formed on the second metal layer 2240*b* in the word-line bonding area WLBA. In the word-line bonding area WLBA, the lower bonding metals 2271*b* and 2272*b* of the peripheral circuit region PERI may be electrically connected to the upper bonding metals 2371*b* and 2372*b* of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271*b* and 2272*b* in the peripheral circuit region PERI and upper bonding metals 2371*b* and 2372*b* of the cell region CELL.

Figure 26:
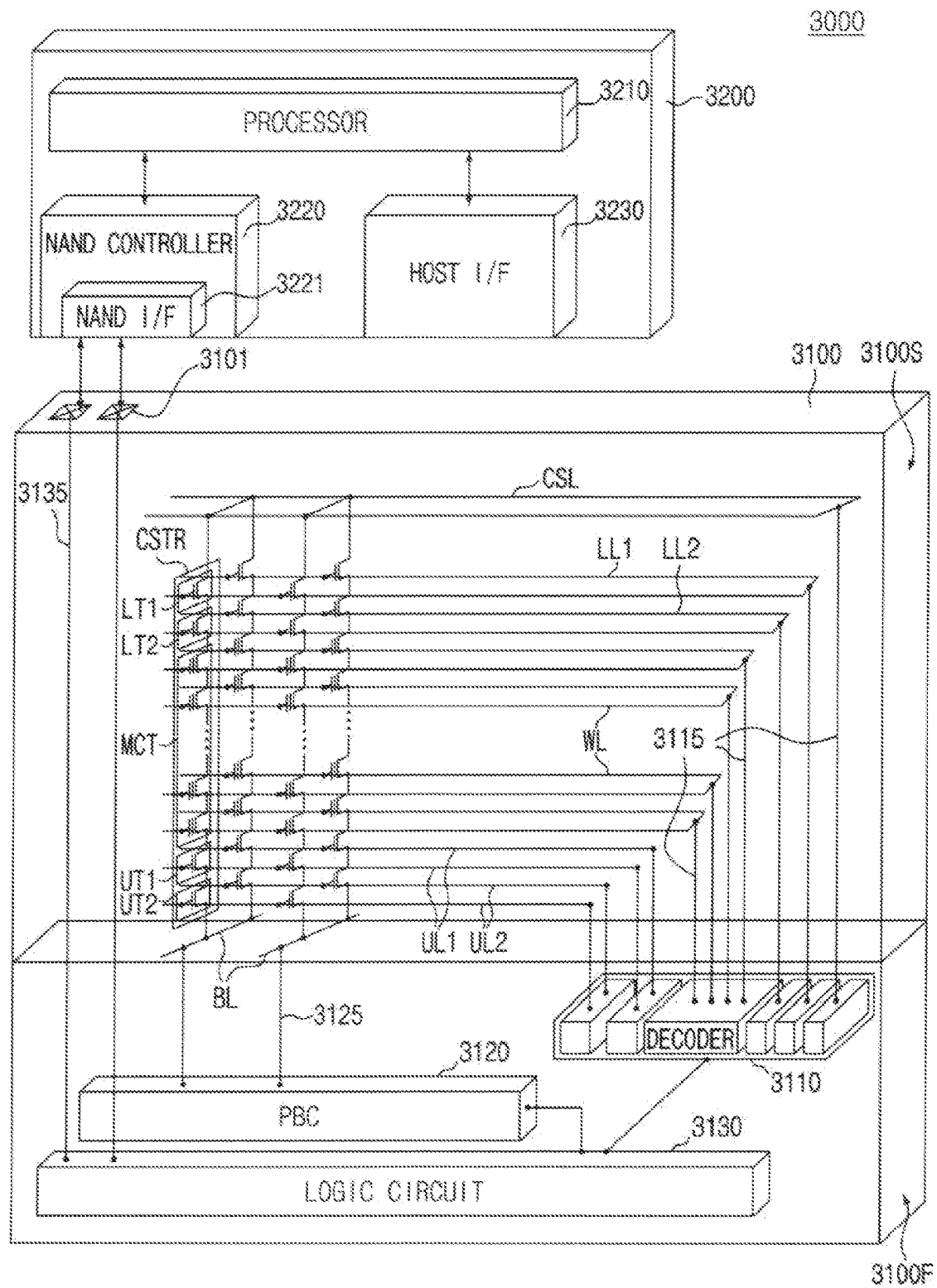
FIG. 26 is a block diagram illustrating an electronic system including a semiconductor device according to an embodiment.

FIG. 26 is a block diagram illustrating an electronic system including a semiconductor device according to example embodiments.

Referring to FIG. 26, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a nonvolatile memory device, for example, a nonvolatile memory device that will be illustrated with reference to FIGS. 5 through 13D. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to example embodiments may be packaged using various package types or package configurations.

The present disclosures may be applied to various electronic devices including a nonvolatile memory device. For example, the present disclosures may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the disclosure. Accordingly, all such modifications are intended to be included within the scope of the disclosure as defined in the claims.

What is claimed is:

1. A storage device comprising:
   a nonvolatile memory device including a memory cell array, wherein the memory cell array includes:
   a plurality of word-lines stacked on a substrate,
   a plurality of memory cells provided in a plurality of channel holes extending in a vertical direction with respect to the substrate, and
   a word-line cut region extending in a first horizontal direction and dividing the plurality of word-lines into a plurality of memory blocks; and
   a storage controller configured to control the nonvolatile memory device,
   wherein the storage controller is configured to group a plurality of target memory cells coupled to a target word-line into outer cells and inner cells based on a location index of each target memory cell of the target memory cells,
   wherein a distance between the outer cells and the word-line cut region is smaller than a distance between the inner cells and the word-line cut region,
   wherein the storage controller includes an error correction code (ECC) decoder configured to perform an ECC decoding operation on an ECC sector by:
   obtaining outer cell bits which are read from the outer cells in the ECC sector during a read operation on the plurality of target memory cells, and inner cell bits which are read from the inner cells in the ECC sector during the read operation; and applying a first set of log likelihood ratio (LLR) values to the outer cell bits and applying a second set of LLR values to the inner cell bits, wherein the second set of LLR values is different from the first set of LLR values.

2. The storage device of claim 1, wherein a first number of the first set of LLR values is greater than a second number of the second set of LLR values.

3. The storage device of claim 1, wherein the storage controller is further configured to group the target memory cells into mid cells disposed between the outer cells and the inner cells, and wherein the ECC decoder is further configured to apply a third set of LLR values to mid cell bits read from the mid cells.

4. The storage device of claim 1, wherein the storage controller is further configured to group each outer cell of the outer cells and each inner cell of the inner cells into at least two groups based on a distance between the word-line cut region and the each outer cell or the each inner cell; and wherein the ECC decoder is configured to apply different the LLR values to the at least two groups.

5. The storage device of claim 1, wherein the ECC decoder is configured to perform a soft decision decoding on the ECC sector by applying different LLR intervals to the outer cell bits and the inner cell bits.

6. The storage device of claim 5, wherein the ECC decoder is configured to apply a first LLR value to the outer cell bits, and to apply a second LLR value to the inner cell bits during an LLR interval from among the different LLR intervals, and wherein an absolute value of the first LLR value is smaller than an absolute value of the second LLR value.

7. The storage device of claim 1, wherein the plurality of word-lines include a plurality of NAND strings, and each NAND string of the plurality of NAND strings includes stacked memory cells which are stacked in the vertical direction; and wherein the storage controller further includes a processor configured to control the ECC decoder.

8. The storage device of claim 7, wherein the processor is configured to apply a single location index to at least two NAND strings from among the plurality of NAND strings, wherein the at least two NAND strings share a channel hole from among the plurality of channel holes.

9. The storage device of claim 7, wherein the processor is configured to apply a different location index to each NAND string of the plurality of NAND strings.

10. The storage device of claim 7, wherein the processor is configured to apply an individual location index to each memory block of the plurality of memory blocks.

11. The storage device of claim 1, wherein the storage controller further includes a processor configured to control the ECC decoder to apply the different LLR values to a portion of the plurality of word-lines.

12. The storage device of claim 1, wherein the ECC decoder includes:

a read data manger configured to store data read from the target word-line, and to output read data corresponding to the ECC sector;

a register configured to store a plurality of sets of LLR values including a first set of LLR values and a second set of LLR values;

an LLR mapper configured to output LLR data by mapping the first set of LLR values and the second set of LLR values to the ECC sector; and a decoder configured to:

update values of variable nodes and values of check nodes by performing node operations based on the LLR data, and output a decoded data or an error message by performing a decoding on the LLR data based on the updated values of the variable nodes.

13. The storage device of claim 12, wherein the read data manager is configured to:

store the data read from the target word-line based on a default read voltage as first read data; and store the data read from the target word-line based on offset read voltages different from the default read voltage as second read data.

14. The storage device of claim 13, wherein the LLR mapper, in a soft decision read operation performed based on the offset read voltages, is configured to:

map the first set of LLR values to the outer cell bits in the second read data; and map the second set of LLR values to the inner cell bits in the second read data.

15. The storage device of claim 12, wherein the decoder includes:

a variable node processor including the variable nodes, wherein the variable node processor is configured to store the LLR data and to provide the LLR data to a first switch network as a variable node message;

a check node processor connected to the first switch network and including the check nodes, wherein the check node processor is configured to process a value of each of the variable nodes with respect to each of the check nodes, by referring to the variable node message to provide the processed value to a second switch network as a check node message; and a decision logic circuit connected to the variable node processor, wherein the variable node processor is further configured to update the values of the variable nodes by referring to the check node message, and to perform the decoding based on the updated values of the variable nodes, and wherein the decoder is configured to output the decoded data or the error message based on a result of the decoding.

16. The storage device of claim 1, wherein the memory cell array includes a first region and a second region, wherein the nonvolatile memory device further includes:

a voltage generator configured to generate word-line voltages based on control signals;

an address decoder coupled to the memory cell array through the plurality of word-lines, wherein the address decoder is configured to transfer the word-line voltages to the memory cell array based on a row address;

a page buffer circuit coupled to the memory cell array through a plurality of bit-lines, wherein the page buffer circuit is configured to store user data in the memory cell array; and a control circuit configured to control the voltage generator, the address decoder and the page buffer circuit based on a command and an address received from the storage controller, wherein the memory cell array includes the plurality of memory blocks, wherein at least one memory block of the plurality of memory blocks includes a plurality of NAND strings, and wherein each NAND string of the plurality of NAND strings includes stacked memory cells which are stacked in the vertical direction.

17. A method of operating a storage device including a nonvolatile memory device which includes a memory cell array, the memory cell array including a plurality of word-lines stacked on a substrate, a plurality of memory cells provided in a plurality of channel holes extending in a vertical direction with respect to the substrate, and a word-line cut region extending in a first horizontal direction and dividing the plurality of word-lines into a plurality of memory blocks, the method comprising:

grouping, by a storage controller configured to control the nonvolatile memory device, a plurality of target memory cells coupled to a target word-line into outer cells and inner cells based on a location index of each target memory cell of the target memory cells, wherein a distance between the outer cells and the word-line cut region is smaller than a distance between the inner cells and the word-line cut region;

obtaining, by an error correction code (ECC) decoder included in the storage controller, outer cell bits which are read from the outer cells in the ECC sector during a read operation on the plurality of target memory cells, and inner cell bits which are read from the inner cells in the ECC sector during the read operation;

applying, by the ECC decoder, a first set of log likelihood ratio (LLR) values to outer cell bits and a second set of LLR values to inner cell bits, wherein the first set of LLR values is different from the second set of LLR values; and performing, by the ECC decoder, an ECC decoding operation on an ECC sector based on the different LLR values.

18. The method of claim 17, wherein a first number of the first set of LLR values is greater than a second number of the second set of LLR values, wherein the ECC decoder is configured to apply to a first LLR value to the outer cell bits and to apply a second LLR value to the inner cell bits during an LLR interval from among different LLR intervals, and wherein an absolute value of the first LLR value is smaller than an absolute value of the second LLR value.

19. A storage device comprising:

a plurality of memory cells provided in a plurality of channel holes extending through a plurality of word-lines stacked on substrate, wherein the plurality memory cells are coupled to a word-line from among the plurality of word-lines; and a word-line cut region dividing the plurality of word-lines into a plurality of memory blocks; and an error correction code (ECC) decoder configured to:
obtain a first bit read from a first memory cell and a second bit read from a second memory cell during a read operation on the plurality of memory cells, and
perform ECC decoding on an ECC sector corresponding to the first memory cell and the second memory cell by applying a first log likelihood ratio (LLR) value to the first bit and a second LLR value to the second bit, wherein the first LLR value is different from the second LLR value, wherein the first LLR value is determined based on a distance between the first memory cell and the word-line cut region, and the second LLR value is determined based on a distance between the second memory cell and the word-line cut region.

* * * * *